United States Patent
Miyasaka

(12) 
(10) Patent No.: US 6,391,690 B2
(45) Date of Patent: *May 21, 2002

(54) THIN FILM SEMICONDUCTOR DEVICE AND METHOD FOR PRODUCING THE SAME

(75) Inventor: Mitsutoshi Miyasaka, Nagano-ken (JP)

(73) Assignee: Seiko Epson Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/817,650

(22) PCT Filed: Aug. 7, 1996

(86) PCT No.: PCT/JP96/02220

§ 371 Date: Apr. 23, 1997

§ 102(e) Date: Apr. 23, 1997

(87) PCT Pub. No.: WO97/22142

PCT Pub. Date: Jun. 19, 1997

Related U.S. Application Data

(63) Continuation-in-part of application No. 08/633,723, filed as application No. PCT/JP95/02568 on Dec. 4, 1995.

(51) Int. Cl.[7] .......................... H01L 21/00; H01L 21/84
(52) U.S. Cl. ................. 438/149; 438/197; 438/778
(58) Field of Search .......................... 438/197, 778, 438/149

(56) References Cited

U.S. PATENT DOCUMENTS 4,727,044 A * 2/1988 Yamazaki
4,842,897 A   6/1989 Takeuchi et al.

(List continued on next page.)

FOREIGN PATENT DOCUMENTS

EP   0 489 541 A2   10/1992
EP   0 562 623 A  *  9/1993

(List continued on next page.)

OTHER PUBLICATIONS

Wolf et al., Silicon Processing for the VLSI Era, pp 173, 1986.*

S. Wolf and R.N Tauber; Silicon Processing for the VLSI Era, V.1—Process Tech. pp. 57–58, 1986.*

A.T.M. Wilbers, G.J. Meeusen, M. Hawerlag, G.M.W. Kroesen, D.C. Schram, Amorphous Hydrogenated silicon films produced by an expanding argon–silane plasma investigated with spectroscopic IR ellipsometry, pp. 59–75, 1991.*

(List continued on next page.)

Primary Examiner—Long Pham
Assistant Examiner—Scott J. Hawranek
(74) Attorney, Agent, or Firm—Oliff & Berridge, PLC

(57) ABSTRACT

In order to fabricate a high performance thin film semiconductor device using a temperature process in which it is possible to use inexpensive glass substrates, a highly crystalline mixed-crystallinity semiconductor film is deposited by means of PECVD using a silane as the source gas and argon as the dilution gas, then the crystallinity of this film is improved by such means as laser irradiation. Thin film semiconductor devices fabricated in this way are used in the manufacture of such things as liquid crystal displays and electronic devices.

In applying the present invention to the fabrication of an active matrix liquid crystal display, it is possible to both easily and reliably fabricate a large, high-quality liquid crystal display. Additionally, in applying the present invention to the fabrication of other electronic circuits as well, it is possible to both easily and reliably fabricate high-quality electronic circuits.

9 Claims, 11 Drawing Sheets

U.S. PATENT DOCUMENTS

| | | | |
|---|---|---|---|
| 4,900,694 A | | 2/1990 | Nakagawa |
| 5,288,658 A | | 2/1994 | Ishihara |
| 5,318,801 A | | 6/1994 | Snail et al. |
| 5,352,636 A | | 10/1994 | Beinglass |
| 5,374,481 A | | 12/1994 | Jeng et al. |
| 5,464,795 A | | 11/1995 | Oguro |
| 5,476,798 A | * | 12/1995 | Guha |
| 5,776,819 A | * | 7/1998 | Mahan et al. |

FOREIGN PATENT DOCUMENTS

| | | | |
|---|---|---|---|
| JP | 58-182272 | | 10/1983 |
| JP | 60-140815 | | 7/1985 |
| JP | 62-104117 | | 5/1987 |
| JP | 2-84716 | | 3/1990 |
| JP | 2-181974 | | 7/1990 |
| JP | 4-206630 | | 7/1992 |
| JP | 4-245482 | | 9/1992 |
| JP | 4-287314 | | 10/1992 |
| JP | 4-313273 | | 11/1992 |
| JP | 4-346419 | | 12/1992 |
| JP | 5-62917 | | 3/1993 |
| JP | 405062917 | * | 3/1993 |
| JP | 5-235039 | | 9/1993 |
| JP | 5-246794 | | 9/1993 |
| JP | 5-275336 | | 10/1993 |
| JP | 6-21459 | | 1/1994 |
| JP | 6-77251 | | 3/1994 |
| JP | 6-97078 | | 4/1994 |
| JP | 6-132306 | | 5/1994 |
| JP | 6-163401 | | 6/1994 |
| JP | 6-244419 | | 9/1994 |
| JP | 7-142405 | | 6/1995 |
| JP | 7-147239 | | 6/1995 |

OTHER PUBLICATIONS

Kunio Masumo et al., "Low–Temperature Preparation of Poly–Si TFT by Ar Laser Annealing at High Scanning Speed," *Electronics and Communications in Japan*, Part 2, vol. 76, 1993, Sep., No. 9, New York, pp. 112–116.

Satoshi Takenaka et al., "High Mobility Poly–Si Thin Film Transistors Using Solid Phase Crystallized a–Si Films Deposited by Plasma–Enhanced Chemical Vapor Deposition," *Japanese Journal of Applied Physics*, vol. 29, No. 12, Part 2, 1990, Dec., Tokyo, JP, pp. L2380–2383.

I. Sieber et al., "Microscopic Characterization of Microcrystalline Silicon Thin Films," *Thin Solid Films* 276 (1996) Elsevier Science S.A. 1996, pp. 314–317.

Tetsuya Akasaka et al., In Situ Ellipsometric Observations of the Growth of silicon Thin Films from Fluorinated Precursors, $SiF_nH_m(n+m \leq 3)$, *Japanese Journal of Applied Physics*, vol. 32 (1993) Jun., No. 6A, Part 1, Tokyo, JP, pp. 2607–2612.

H. Ohshima et al., "Full–Color LCDs with Completely Integrated Drivers Utilizing Low–Temperature Poly–Si TFTs," *SID 93 Digest*, pp. 387–390.

* cited by examiner

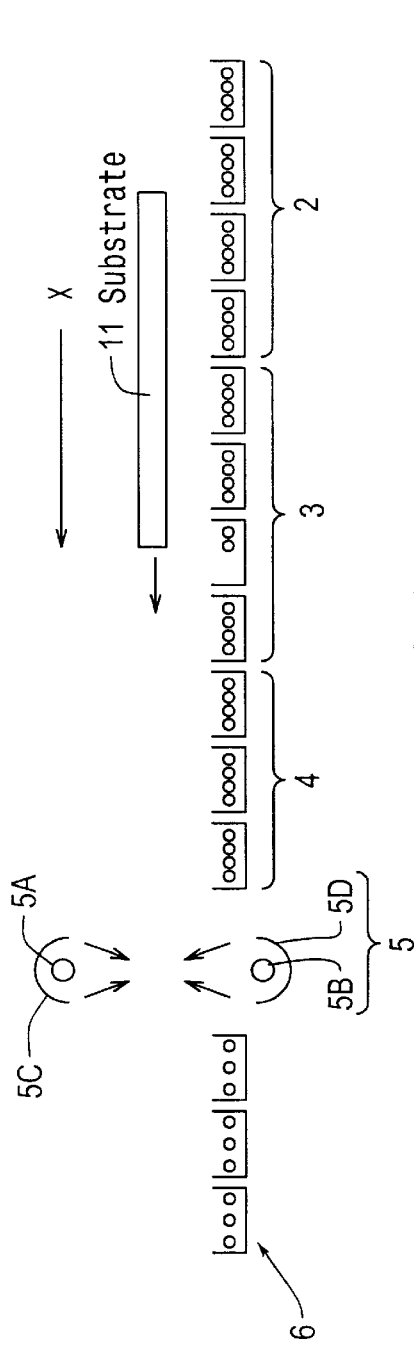
Fig. 14A
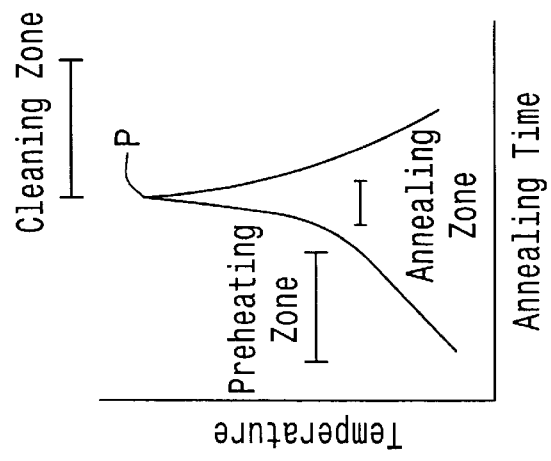
Fig. 14C
Fig. 14B

US 6,391,690 B2

THIN FILM SEMICONDUCTOR DEVICE AND METHOD FOR PRODUCING THE SAME

This application is described and claimed international application number PCT/JP96/02220 filed Aug. 7, 1996, which is a continuation-in-part of Internation Application No. PCT/JP95/02568, filed Dec. 14, 1995. (The U.S. National Stage Application of PCT/JP95/02568 is application Ser. No. 08/633,723 filed Apr. 22, 1996).

FIELD OF TECHNOLOGY

The present invention relates first of all to thin film semiconductor devices, and the fabrication methods for such devices, which are suitable for active matrix liquid crystal displays and the like. The present invention also relates to liquid crystal displays for which the thin film semiconductor devices are appropriate, the fabrication processes for such liquid crystal displays, electronic devices, and the fabrication processes for such electronic devices. Further, the present invention relates to thin film deposition processes using plasma-enhanced chemical vapor deposition (PECVD).

BACKGROUND TECHNOLOGY

In recent years, along with increases in screen size and improvements in resolution, the driving methods for liquid crystal displays (LCDS) are moving from simple matrix methods to active matrix methods; and the displays are becoming capable of displaying large amounts of information. LCDs with more than several tens of thousands pixels are possible with active matrix methods which place a switching transistor at each pixel. Transparent insulating substrates such as fused quartz and glass which allow the fabrication of transparent displays are used as substrates for all types of LCDs. Although ordinarily semiconductor layers such as amorphous silicon or polycrystalline silicon are used as the active layer in thin film transistors (TFTs), the use of polycrystalline silicon which has higher operating speed is advantageous when producing monolithic displays which include integrated driving circuits. When polycrystalline silicon is used as the active layer, fused quartz is used as the substrate; and a so-called "high temperature" process in which the maximum processing temperature exceeds 1000° C. is used to fabricate the TFTs. In this case, the mobility of the polysilicon layer attains values from about 10 $cm^2 \times V^{-1} \times sec^{-1}$ to 100 $cm^2 \times V^{-1} \times sec^{-1}$.

On the other hand, for the case of an amorphous silicon active layer, a common glass substrate can be used since the maximum processing temperature is about 400° C. The mobility of an amorphous silicon layer attains values from about 0.1 $cm^2 \times V^{-1} \times sec^{-1}$ to 1 $cm^2 \times V^{-1} \times sec^{-1}$. For increases in LCD display size while maintaining low costs, the use of low-cost common glass substrates is indispensable. The previously mentioned amorphous silicon layers, however, have such problems as electrical characteristics far inferior to those of polysilicon layers and slow operating speed. Since the high temperature process polysilicon TFTs use quartz substrates, however, there are problems with increasing display size and increasing costs. Therefore, there is presently a strong need for technology which can fabricate a thin film semiconductor device employing a semiconductor layer such as polycrystalline silicon as the active layer upon a common glass substrate. But, when using large substrates which are well-suited to mass production, there is a severe restriction in that the substrates must be kept below a maximum processing temperature of about 400° C. in order to avoid substrate deformation. In other words, technology which can produce, under such restrictions, the active layer of thin film transistors capable of controlling a liquid crystal display and of thin film transistors which can operate driving circuits at high speed is desired. These devices are presently known as the low temperature poly-Si TFTS, and development of them is progressing.

The first type of prior art corresponding to existing low temperature poly-Si TFTs is shown on p. 387 of the SID (Society for Information Display) '93 Digest (1993). According to this description, 50 nm of amorphous silicon (a-Si) is first deposited at 550° C. by LPCVD using monosilane ($SiH_4$) as the source gas and then converted from a-Si to poly-Si by laser irradiation. After patterning of the poly-Si layer, a gate insulator layer of $SiO_2$ is deposited by ECR-PECVD at a substrate temperature of 100° C. Following formation of the tantalum (Ta) gate electrode over the gate insulator layer, self-aligned transistor source and drain regions are formed in the silicon layer by ion implantation of donor or acceptor impurities while using the gate electrode as a mask. This ion implantation, known as "ion doping", is accomplished by a non-mass separating ion implanter. Hydrogen-diluted phosphine ($PH_3$), diborane ($B_2H_6$) or similar gas is used as a source gas for ion doping. Activation of the impurities is carried out at 300° C. Following deposition of an interlevel insulator layer, electrodes and interconnects such as indium tin oxide (ITO) and aluminum (Al) are deposited to complete the thin film semiconductor device. Therefore, the maximum processing temperature in this prior art is the 550° C. used for deposition of the a-Si by LPCVD (abbreviated hereafter as LPCVD a-Si).

The prior art exemplified in Japanese Unexamined Patent Application Heisei 6-163401 is representative of a second type of existing low temperature poly-Si TFT technology. The principle feature of this technology, in contrast to the use of LPCVD a-Si in the first type of prior art, is a process in which an a-Si film is deposited by plasma CVD (PECVD), the deposited film is given a so-called "dehydrogenation anneal" at a temperature between approximately 300° C. and 450° C., and then laser irradiated to form a poly-Si film. The following description is given in paragraph [0033] of the same document. "Using plasma CVD, a 200 nm thick silicon oxide passivation layer 2 and a 100 nm thick amorphous silicon thin film 3 were formed on top of glass substrate 1 (Corning 7059) at a substrate temperature of 200° C. After a 30 minute anneal at 300° C., amorphous silicon film 3 was polycrystallized using a 13 W argon ion laser, focused to approximately a 50 mm diameter spot size, with a scan speed of approximately 11 m/sec (scan speed of the beam spot diameter×220000/sec)."

As shown in this example, thermal annealing prior to the crystallization step is necessary when crystallizing an a-Si film deposited by PECVD (abbreviated hereafter as PECVD a-Si). If annealing is not done or if the temperature of the anneal is low, crystallization does not proceed at all when the irradiating laser energy intensity is weak. Conversely, if the energy intensity is strong, the Si film is damaged and the PECVD a-Si film again does not crystallize at all. This situation will be explained using the inventor's experimental results shown in FIG. 1.

The sample is a glass substrate (Nippon Electric Glass Co., Ltd.'s OA-2) over which was deposited a 2500 Å thick a-Si film by a parallel plate PECVD reactor. The deposition conditions were a monosilane ($SiH_4$) flow rate of 225 SCCM, a hydrogen ($H_2$) flow rate of 1300 SCCM, RF power of 150 W, pressure of 1.3 torr, electrode surface area of 1656 cm$^2$ (giving an applied power density of 0.091 W/cm$^2$), electrode separation distance of 24.4 mm, a substrate temperature of 300° C., and a deposition rate of the PECVD a-Si film at this time of 547 A/min. This film is a typical PECVD a-Si from the prior art and contains approximately 10.3 atomic % hydrogen and has a silicon atomic density of 4.38×10$^{22}$ cm$^{-3}$. Additionally, the infrared absorption spectrum (IR) for this a-Si film is shown in FIG. 5; and Raman spectroscopy results are shown in FIG. 6. The Si—H stretching mode can be seen around 2000 cm$^{-1}$ in the infrared absorption spectrum of FIG. 5. On the other hand, the transverse optical component from amorphous silicon can be seen around 480 cm$^{-1}$ by Raman spectroscopy. Both results indicate that the amorphous film is a-Si in which hydrogen is bonded to silicon.

FIG. 1 shows the results of laser irradiation following annealing of the a-Si film in a nitrogen atmosphere at a fixed temperature for one hour. The horizontal axis of FIG. 1 shows the annealing temperature, and the vertical axis shows the laser energy. A. D. on the horizontal axis is an abbreviation for "as-deposited" and means the PECVD a-Si film immediately after deposition which has been given no annealing treatment. In FIG. 1, A indicates an amorphous condition, C indicates a crystallized condition, and D indicates a damaged condition. For example, the position labeled A at A. D. on the horizontal axis and 150 mJ–cm$^{-2}$ on the vertical axis indicates that when the unannealed PECVD a-Si film was laser irradiated at an energy density of 150 mJ–cm$^{-2}$, the film remained amorphous after the laser irradiation.

As shown in this figure, for PECVD a-Si films of the prior art, crystallization does not proceed at all for the as-deposited condition if the energy is low (approximately 160 mJ×cm$^{-2}$ or less), and damage is introduced if the energy is high (160 mJ×cm$^{-2}$ or more) and all function as a semiconductor is lost. When the PECVD a-Si film is annealed, the crystallized region (the region marked as C in FIG. 1) expands as the annealing temperature increases. For example, for a film annealed at 300° C., the only point for which crystallization occurs is at a laser energy of 180 mJ×cm$^{-2}$; but if the annealing temperature is raised to 390° C., crystallization occurs over a wide range of energies from 190 mJ×cm$^{-2}$ to 310 mJ×cm$^{-2}$.

Although FIG. 1 has been classified into three regions of amorphous (A), crystalline (C), and damaged (D) in order to make the condition of the Si film easy to understand, the crystallization energy region (C) can be further subdivided into regions in which the crystallization proceeded significantly, crystallized regions which are relatively close to amorphous, and crystallized regions which have damage. Regions in which crystallization advanced significantly are shown as circled C's in FIG. 1. These regions showed a relatively high degree of crystallinity of 70% or greater as measured by multiple wavelength spectroscopic ellipsometry or Raman spectroscopy.

As a result, in order to crystallize a PECVD a-Si by laser irradiation, the deposited film must be annealed at a temperature of around 400° C. or higher. Because of non-uniformity in laser energy density from shot to shot during laser irradiation and to obtain a uniform, high-quality crystallized film, an actual annealing temperature of approximately 450° C. or higher is used. For low temperature process poly-Si TFTs corresponding to the second type of prior art, poly-Si TFTs are produced using the same process described above for the first type of low temperature poly-Si TFT prior art while making use of polycrystalline silicon films obtained as explained in the preceding section. Consequently, the maximum processing temperature in the second type of prior art is the approximately 450° C. temperature used in annealing prior to the crystallization step of the PECVD a-Si.

The prior art exemplified in Japanese Unexamined Patent Application Heisei 5-275336 is representative of a third type of existing low temperature poly-Si TFT technology. In this prior art, during crystallization of the PECVD a-Si film by laser irradiation, crystallization is achieved without damage by gradually increasing the laser energy. Claim 1 of the same Patent Application states "In the fabrication and polycrystallization procedure of a hydrogenated amorphous semiconductor film by laser irradiation, a polycrystalline semiconductor thin film fabrication process characterized by the gradual increase in laser irradiation energy and the gradual dehydrogenation of the hydrogenated amorphous semiconductor film." Additionally, the following comments are made in paragraphs [0022] to [0026] of the same document.

[0022] Concerning the laser irradiation of the a-Si: H film, the laser output energy is initially set at a value less than that necessary to effect crystallization of the a-Si: H film; and, while scanning repeatedly at a fixed energy such as 160 mJ (actually, since the overall transmission of the optical system is 70% and the beam size is 0.9 cm×0.9 cm, the energy density at the surface of the film is 138 mJ/cm$^2$), the amount of hydrogen is monitored with a mass spectrometer until the point at which the amount is found not to change significantly from the previous laser scan, after which the output energy is increased slightly to a value such as 200 mJ (energy density of 173 mJ/cm$^2$) and the laser again scanned repeatedly while monitoring the hydrogen as described previously. The energy is then increased, for example, to 240 mJ (energy density of 207 mJ/cm$^2$) and the same process repeated, so that by gradually increasing the energy and repeating the above process, the hydrogen contained within the a-Si: H film is liberated little by little. After this, the aforementioned a-Si: H film is converted to a polycrystalline silicon layer by using a sufficient laser energy to effect crystallization. Further, it is also acceptable to change the laser irradiation energy by leaving the output energy unchanged and constricting the beam size (changing the energy per unit area of the surface being treated).

[0023] FIG. 3 is a schematic drawing of this type of laser annealing condition. 81 is a glass substrate (one section of TFTs has a deposited film), 82 is the a-Si: H film to be used for formation of the pixel TFTs, and 83 is the a-Si: H film to be used for formation of the drivers.

[0024] According to this type of specific example, first, a relatively low laser energy is used for irradiation of the a-Si: H film; and hydrogen corresponding to that energy is liberated. By using the same energy for multiple scanning irradiation, hydrogen corresponding to the particular energy gradually decreases in accordance with the number of scans, and eventually essentially all the hydrogen is eliminated. Next, the energy is increased slightly above the level used in the previous irradiations, and through the same process, hydrogen corresponding to the increased energy level is gradually generated and eliminated in accordance with the number of scans. In this fashion, by increasing the laser energy, the hydrogen is gradually eliminated beginning with hydrogen corresponding to low energies and progressing to hydrogen corresponding to high energies.

[0025] Consequently, the hydrogen contained in the a-Si: H film is gradually eliminated step by step, and since the progression to higher energies is made while monitoring the amount of hydrogen, the film is essentially undamaged. Since the amount of hydrogen remaining in the film is small when the essentially dehydrogenated a-Si: H film is irradiated with a high energy in order to polycrystallize the film, even if the remaining hydrogen is all liberated at once, the film is not damaged. In contrast, if an a-Si: H film is irradiated with sufficient energy to polycrystallize the film, the contained hydrogen is liberated all at once in an eruption that damages the film.

[0026] In the process above, when a stage is reached in which the amount of hydrogen generated is less than a previously determined amount even if the laser irradiation energy is increased, the a-Si: H film is irradiated for the first time by laser light having an energy necessary to convert the film into a polycrystalline film.

Following the attainment of a polycrystalline silicon film in this manner; poly-Si TFTs are produced by the same fabrication procedure described above for the first type of prior art.

Also, in the single substrate PECVD of the prior art, when depositing a thin film, there is a reaction chamber and a separate preheating chamber. After the substrate is heated in the preheating chamber, the substrate is transferred to the reaction chamber by a transfer chamber robot. After being set in the reaction chamber, the thin film is deposited after the substrate has been further heated in the reaction chamber.

As described above, however, there are several inherent problems with poly-Si TFTs fabricated by each of the existing technologies in the prior art of the low temperature process which act as impediments to the adoption of these technologies into mass production.

Problems associated with the first type of prior art.

1-1. The high processing temperature of 550° C. prevents the use of low-priced glass leading to a steep rise in product prices. Additionally, the degree of warp of the glass substrates as a result of their own weight increases as substrate size increases, and increases in liquid crystal display (LCD) sizes are not possible.

1-2. There is a thought to move from the present 360 mm×460 mm glass substrates for LCDs to larger 550 mm×650 mm substrates, but there are no LPCVD reactors which can accommodate the increase in substrate size.

Problems associated with the second type of prior art.

2-1. Compared to LPCVD a-Si, the appropriate irradiation conditions necessary to obtain uniform laser irradiation over the entire substrate are restricted; and as explained previously, the suitable range becomes narrower as the annealing temperature decreases. As a result, the annealing temperature must be increased from about 450° C. to about 500° C. Accompanying this, it becomes impossible to use low-priced glass leading to a steep rise in product prices. Additionally, the degree of warp of the glass substrates as a result of their own weight increases as substrate size increases, and increases in liquid crystal display (LCD) sizes are not possible. Conversely, with the use of a low annealing temperature less than about 450° C., the degree of crystallization from the laser irradiation can vary from uniform to non-uniform from lot to lot and reliable production is not possible. If the degree of crystallization is low, a good quality crystalline semiconductor film cannot be obtained.

2-2. Regardless of whether the temperature is high or low, annealing is necessary. Therefore, an annealing furnace is necessary in addition to the PECVD reactor. Since the addition of a vacuum system to a common annealing furnace results in an LPCVD reactor, the cost of an annealing furnace is on the same order as the cost of an LPCVD reactor. For this reason, the second type of prior art is comparatively more expensive than the first type of prior art. Also, as the process becomes longer, the product yield decreases. Additionally, as for the case in 1-2 above, there are no furnaces available which can accommodate increases in substrate size.

Problems associated with the third type of prior art.

3-1. As shown in the quotation above, in order to eliminate hydrogen, multiple laser irradiation scanning is done at 135 mJ/cm$^2$, followed by multiple laser irradiation scanning at 173 mJ/cm$^2$, followed again by multiple laser irradiation scanning at 207 mJ/cm$^2$, and the energy is gradually increased and the same process repeated. After the majority of the contained hydrogen has been eliminated, the a-Si film is crystallized. In order to crystallize a PECVD a-Si film in this fashion, at least several tens of laser irradiations or more are necessary. As a result, the productivity decreases noticeably, receding to a steep rise in product prices. Additionally, when repeatedly irradiating the same location, the atmosphere surrounding the substrate must be carefully controlled. If the laser irradiation is carried out in an air atmosphere, oxygen from the atmosphere is incorporated into the film with every laser irradiation. During dehydrogenation, oxygen can be captured by the unsatisfied bonds (dangling bonds) resulting from the loss of hydrogen; and, during crystallization, oxygen can be incorporated into the film during the time when Si atoms are mobile. When the number of laser irradiations is several rL petitions, the incorporation of oxygen from the atmosphere is slight and it is not a problem; but if laser irradiation is repeated for several tens of repetitions, sufficient attention must be paid to the incorporation of oxygen into the film. (It goes without saying that the incorporation of oxygen into films of the usual semiconductors such as Si, (Ge, GaAs, and others causes a decrease in semiconductor properties.) Consequently, in the third type of prior art, if the laser irradiation is not performed in vacuum or a nonoxygen atmosphere, it is not possible to obtain semiconductor films without oxygen. This means further decreases in productivity and further increases in product prices.

3-2. As explained in Section 3-1 above for this type of prior art, after laser irradiation scanning with a low laser energy, the energy is gradually increased. In crystallization by this type of laser irradiation, the grain size does not become large, and the polycrystalline semiconductor film is composed of relatively small diameter grains. Therefore, a good quality semiconductor cannot be obtained even if there is no oxygen incorporation; and the characteristics of a thin film semiconductor device using this type of film will not be good.

The present invention aims to solve the problems noted above with the primary purpose of providing a means for reliably producing good thin film semiconductor devices through a realistically convenient method using a fabrication process and processing temperature which will allow the use of common large glass substrates.

On the other hand, when an amorphous silicon film is used as the active layer in a thin film semiconductor device (hereafter abbreviated as a-Si TFT), the mobility is on the order of 0.1 $cm^2 \times V^{-1} \times sec^{-1}$; and a problem arises in that the response speed is too slow for switching elements in a high-precision color LCD having, for example, 768 (rows)×1024 (columns)×3 (colors)×2359296 (pixels), and the TFTs cannot be used. In other words, there is a strong need for a thin film semiconductor device (and accompanying fabrication method) which has both an equivalent fabrication procedure to that of existing a-Si TFT's and mobilities of 1 $cm^2 \times V^{-1} \times sec^{-1}$ or more.

Consequently, the present invention aims, as a second objective, to solve the problem noted above with the second objective being the provision of a thin film semiconductor device, and its fabrication method, which has a fabrication method similar to the fabrication process for a-Si TFTs and mobilities greater than or equal to 1 $cm^2 \times V^{-1} \times sec^{-1}$.

Also, since preheating chambers are indispensable in the deposition method using single substrate PECVD reactors, a problem arises in that increases in PECVD reactor size lead to steep increases in price. Additionally, since the temperature of the robot in the transfer chamber is around room temperature while the temperature of the preheating chamber is more than about 300° C., the temperature of the substrates decreases during the time that the substrates are being transferred from the preheating chamber to the reaction chamber. After the substrates are set in the reaction chamber, a long preheat is still necessary; and this is one cause of decreased productivity.

Consequently, the present invention aims, as a third objective, to solve the problem noted above with the third objective being the provision of a thin film deposition method which is both convenient and has high productivity even when using a single substrate PECVD reactor.

DESCRIPTION OF THE INVENTION

In a fabrication process for a thin film semiconductor device having as the active layer of a transistor a semiconductor film, said semiconductor film being formed over an insulating material on the substrate, at least a portion of which is an insulating material; the present invention is characterized by the inclusion of a process in which said semiconductor film is deposited by plasma-enhanced chemical vapor deposition (PECVD) to a thickness of from approximately 40 nm to 300 nm using chemical species containing constitutive elements of said semiconductor film as source gases and, moreover, using argon (Ar) as an additional gas. The present invention is also characterized by the fact that the aforementioned semiconductor film is silicon and the aforementioned source gas is a silane ($SiH_4$, $Si_2H_6$, $Si_3H_8$).

In a fabrication process for a thin film semiconductor device having as the active layer of a transistor a semiconductor film, said semiconductor film being formed over an insulating material on the substrate, at least a portion of which is an insulating material; the present invention is characterized by the inclusion of a process in which said semiconductor film is deposited by plasma-enhanced chemical vapor deposition (PECVD) using a chemical specie containing constitutive elements of said semiconductor film as the source gas with said source gas concentration of approximately 6.25% or less; and, moreover, using argon (Ar) as an additional gas. During this deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In a fabrication process for a thin film semiconductor device having as the active layer of a transistor a semiconductor film, said semiconductor film being formed over an insulating material on the substrate, at least a portion of which is an insulating material; the present invention is characterized by the inclusion of a process in which said semiconductor film is deposited by plasma-enhanced chemical vapor deposition (PECVD) using a chemical specie containing constitutive elements of said semiconductor film as the source gas with a pressure in the reaction chamber during semiconductor film deposition of approximately 1.0 Torr or higher, and, moreover, using argon (Ar) as an additional gas. During this deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In a fabrication process for a thin film semiconductor device having as the active layer of a transistor a semiconductor film, said semiconductor film being formed over an insulating material on the substrate, at least a portion of which is an insulating material; the present invention is characterized by the inclusion of a process in which said semiconductor film is deposited by plasma-enhanced chemical vapor deposition (PECVD) using a chemical specie containing constitutive elements of said semiconductor film as the source gas with an electrode separation in the reaction chamber during semiconductor film growth of approximately 17.8 mm or greater, and, moreover, using argon (Ar) as an additional gas. During this deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In a fabrication process for a thin film semiconductor device having as the active layer of a transistor a semiconductor film, said semiconductor film being formed over an insulating material on the substrate, at least a portion of which is an insulating material; the present invention is characterized by the inclusion of a process in which said semiconductor film is deposited by plasma-enhanced chemical vapor deposition (PECVD) using a chemical specie containing constitutive elements of said semiconductor film as the source gas with said source gas concentration of approximately 6.25% or less, and, moreover, using argon (Ar) as an additional gas and with a pressure in the reaction chamber during said semiconductor film deposition of approximately 1.0 Torr or higher. During this deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In a fabrication process for a thin film semiconductor device having as the active layer of a transistor a semiconductor film, said semiconductor film being formed on top of an insulating material on the substrate, at least a portion of which is an insulating material; the present invention is characterized by the inclusion of a process in which said semiconductor film is deposited by plasma-enhanced chemical vapor deposition (PECVD) using a chemical specie containing constitutive elements of said semiconductor film as the source gas with said source gas concentration of approximately 6.25% or less, and, moreover, using argon (Ar) as an additional gas and with an electrode separation in the reaction chamber during said semiconductor film growth of approximately 17.8 mm or greater. During this deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In the fabrication process of a thin film semiconductor device having as the active layer of a transistor a semiconductor film, said semiconductor film being formed on an insulating material on the substrate, at least a part of which is an insulating material; the present invention is characterized by the inclusion of a process in which said semiconductor film is deposited by plasma-enhanced chemical vapor deposition (PECVD) by plasma-enhanced chemical vapor deposition (PECVD) using a chemical specie containing constitutive elements of said semiconductor film as the source gas and using argon (Ar) as an additional gas while the pressure in the reaction chamber during deposition of the aforementioned semiconductor film is not less than about 1.0 Torr, and the electrode separation distance is not less than about 17.8 mm. During this deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In the fabrication process of a thin film semiconductor device having as the active layer of a transistor a semiconductor film, said semiconductor film being formed on an insulating material on the substrate, at least a part of which is an insulating material; the present invention is characterized by the inclusion of a process in which said semiconductor film is deposited by plasma-enhanced chemical vapor deposition (PECVD) using a chemical specie containing constitutive elements of said semiconductor film as the source gas and using argon (Ar) as an additional gas while the concentration of the aforementioned source gases is not more than 6.25%, the pressure in the reaction chamber during deposition of the aforementioned semiconductor film is not less than about 1.0 Torr and, moreover, that the electrode separation distance is not less than about 17.8 mm. During this deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In the fabrication process of a thin film semiconductor device having as the active layer of a transistor a semiconductor film, said semiconductor film being formed on an insulating material on the substrate, at least a part of which is an insulating material; the present invention is characterized by a first step in which a semiconductor film is deposited by plasma-enhanced chemical vapor deposition (PECVD) using a chemical specie containing constitutive elements of said semiconductor film as the source gas and further, using argon (Ar) as an additional gas; and a second step in which the crystallinity of said semiconductor film is improved. During the deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In the fabrication process of a thin film semiconductor device having as the active layer of a transistor a semiconductor film, said semiconductor film being formed on an insulating material on the substrate, at least a part of which is an insulating material; the present invention is characterized by a first step in which a semiconductor film is deposited by plasma-enhanced chemical vapor deposition (PECVD) using a chemical specie containing constitutive elements of said semiconductor film as the source gas and using argon (Ar) as an additional gas while the concentration of the aforementioned source gases is not more than 6.25%; and a second step in which the crystallinity of said semiconductor film is improved. During the deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In the fabrication process of a thin film semiconductor device having as the active layer of a transistor a semiconductor film, said semiconductor film being formed on an insulating material on the substrate, at least a part of which is an insulating material; the present invention is characterized by a first step in which a semiconductor film is deposited by plasma-enhanced chemical vapor deposition (PECVD) using a chemical specie containing constitutive elements of said semiconductor film as the source gas and using argon (Ar) as an additional gas while the pressure in the reaction chamber during deposition of the aforementioned semiconductor film is not less than about 1.0 Torr; and a second step in which the crystallinity of said semiconductor film is improved. During the deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In the fabrication process of a thin film semiconductor device having as the active layer of a transistor a semiconductor film, said semiconductor film being formed on an insulating material on the substrate, at least a part of which is an insulating material; the present invention is characterized by a first step in which a semiconductor film is deposited by plasma-enhanced chemical vapor deposition (PECVD) using a chemical specie containing constitutive elements of said semiconductor film as the source gas and using argon (Ar) as an additional gas while the electrode separation in the reaction chamber during said semiconductor film growth is not less than about 17.8 mm; and a second step in which the crystallinity of said semiconductor film is improved. During the deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In the fabrication process of a thin film semiconductor device having as the active layer of a transistor a semiconductor film, said semiconductor film being formed on an insulating material on the substrate, at least a part of which is an insulating material; the present invention is characterized by the inclusion of a first step in which said semiconductor film is deposited by plasma-enhanced chemical vapor deposition (PECVD) using a chemical specie containing constitutive elements of said semiconductor film as the source gas and using argon (Ar) as an additional gas while the concentration of the aforementioned source gases is not more than 6.25% and the pressure in the reaction chamber during deposition of the aforementioned semiconductor film is not less than about 1.0 Torr; and a second step in which the crystallinity of said semiconductor film is improved. During the deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In the fabrication process of a thin film semiconductor device having as the active layer of a transistor a semiconductor film, said semiconductor film being formed on an insulating material on the substrate, at least a part of which is an insulating material; the present invention is characterized by the inclusion of a first step in which said semiconductor film is deposited by plasma-enhanced chemical vapor deposition (PECVD) using a chemical specie containing constitutive elements of said semiconductor film as the source gas and using argon (Ar) as an additional gas while the concentration of the aforementioned source gases is not more than 6.25% and the electrode separation in the reaction chamber during said semiconductor film growth is not less than about 17.8 mm; and a second step in which the crystallinity of said semiconductor film is improved. During the deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In the fabrication process of a thin film semiconductor device having as the active layer of a transistor a semiconductor film, said semiconductor film being formed on an insulating material on the substrate, at least a part of which is an insulating material; the present invention is characterized by the inclusion of a first step in which said semiconductor film is deposited by plasma-enhanced chemical vapor deposition (PECVD) using a chemical specie containing constitutive elements of said semiconductor film as the source gas and using argon (Ar) as an additional gas while the pressure in the reaction chamber during deposition of the aforementioned semiconductor film is not less than about 1.0 Torr, and the electrode separation distance is not less than about 17.8 mm; and a second step in which the crystallinity of said semiconductor film is improved. During the deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In the fabrication process of a thin film semiconductor device having as the active layer of a transistor a semiconductor film, said semiconductor film being formed on an insulating material on the substrate, at least a part of which is an insulating material; the present invention is characterized by the inclusion of a first step in which said semiconductor film is deposited by means of plasma-enhanced chemical vapor deposition (PECVD) using a chemical specie containing constitutive elements of said semiconductor film as the source gas and using argon (Ar) as an additional gas while the concentration of the aforementioned source gases is not more than 6.25%, the pressure in the reaction chamber during deposition of the aforementioned semiconductor film is not less than about 1.0 Torr and, moreover, that the electrode separation distance is not less than about 17.8 mm; and a second step in which the crystallinity of said semiconductor film is improved. During the deposition, the present invention is further characterized by a deposition rate of approximately 0.15 nm/sec or higher. It is also characterized by the fact that the aforementioned semiconductor film is silicon and the aforementioned source gas is a silane ($SiH_4$, $Si_2H_6$, $Si_3H_8$).

In the fabrication process for a thin film semiconductor device having as the active layer of a transistor a semiconductor film, said semiconductor film being formed an insulating material on the substrate, at least a portion of which is an insulating material; the present invention is characterized by a first step in which a semiconductor film is deposited by plasma-enhanced chemical vapor deposition (PECVD) using a chemical specie containing constitutive elements of said semiconductor film as the source gas and, further, using argon (Ar) as an additional gas; and a second step in which said semiconductor film is exposed to optical energy or electromagnetic wave energy irradiation. It is also characterized by the fact that the aforementioned semiconductor film is silicon and the aforementioned source gas is a silane ($SiH_4$, $Si_2H_6$, $Si_3H_8$).

In a fabrication process for a thin film semiconductor device having a silicon film as the active layer of a transistor, said silicon film being formed over an insulating material on the substrate, at least a portion of which is an insulating material; the present invention is characterized by the fact that when said silicon film is measured by infrared absorption spectroscopy, there are at least two absorption peaks, one near 2102 $cm^{-1}$ (between 2098 $cm^{-1}$ and 2106 $cm^{-1}$) and the other near 2084 $cm^{-1}$ (between 2080 $cm^{-1}$ and 2088 $cm^{-1}$) and that the intensity of said absorption peak near 2102 $cm^{-1}$ is stronger than the intensity of an absorption peak near 2000 $cm^{-1}$ (between 1980 $cm^{-1}$ and 2020 $cm^{-1}$).

In a fabrication process for a thin film semiconductor device having a silicon film as the active layer of a transistor, said silicon film being formed over an insulating material on the substrate, at least a portion of which is an insulating material; the present invention is characterized by the inclusion of a process in which a silicon film is deposited by plasma-enhanced chemical vapor deposition (PECVD), said silicon film having at least two absorption peaks, one near 2102 $cm^{-1}$ (between 2098 $cm^{-1}$ and 2106 $cm^{-1}$) and the other near 2084 $cm^{-1}$ (between 2080 $cm^{-1}$ and 2088 $cm^{-1}$) and that the intensity of said absorption peak near 2102 $cm^{-1}$ is stronger than the intensity of an absorption peak near 2000 $cm^{-1}$ (between 1980 $cm^{-1}$ and 2020 $c^{-1}$) when measured by infrared absorption spectroscopy.

In a fabrication process of a thin film semiconductor device having a silicon film as the active layer of a transistor, said silicon film being formed over an insulating material on the substrate, at least a portion of which is an insulating material; the present invention is characterized by a first step in which a silicon film is formed, said silicon film having at least two absorption peaks, one near 2102 $cm^{-1}$ (between 2098 $cm^{-1}$ and 2106 $cm^{-1}$) and the other near 2084 $cm^{-1}$ (between 2098 $cm^{-1}$ and 2088 $cm^{-1}$) and that the intensity of said absorption peak near 2102 $cm^{-1}$ is stronger than the intensity of an absorption peak near 2000 $cm^{-1}$ (between 1980 $cm^{-1}$ and 2020 $cm^{-1}$) when measured by infrared absorption spectroscopy; and a second step in which the crystallinity of said silicon film is improved. The present invention is further characterized by the fact that the aforementioned first step is performed by plasma-enhanced chemical vapor deposition (PECVD). In a fabrication process of a thin film semiconductor device having a silicon film as the active layer of a transistor, said silicon film being formed over an insulating material on the substrate, at least a portion of which is an insulating material; the present invention is characterized by a first step in which a silicon film is formed, said silicon film having at least two absorption peaks, one near 2102 $cm^{-1}$ (between 2080 $cm^{-1}$ and 2106 $cm^{-1}$) and the other near 2084 $cm^{-1}$ (between 2098 $cm^{-1}$ and 2088 $cm^{-1}$) and that the intensity of said absorption peak near 2102 $cm^{-1}$ is stronger than the intensity of an absorption peak near 2000 $cm^{-1}$ (between 1980 $cm^{-1}$ and 2020 $cm^{-1}$) when measured by infrared absorption spectroscopy; and a second step in which said silicon film is exposed to optical energy or electromagnetic wave energy irradiation. The present invention is further characterized by the fact that the aforementioned first step is performed by plasma-enhanced chemical vapor deposition (PECVD).

In a fabrication process of a thin film semiconductor device having as the active layer of a transistor a semiconductor film, said semiconductor film being formed over an insulating material on the substrate, at least a portion of which is an insulating material; the present invention is characterized by the fact that said semiconductor film has both amorphous and crystalline components and said amorphous component has a columnar structure. The present invention is further characterized by the fact that the aforementioned semiconductor film is a silicon film.

In a fabrication process of a thin film semiconductor device having as the active layer of a transistor a semiconductor film, said semiconductor film being formed over an insulating material on the substrate, at least a portion of which is an insulating material; the present invention is characterized by a first step in which a semiconductor film having both amorphous and crystalline components, said amorphous component having a columnar structure, is deposited; and a second step in which the crystallinity of said columnar structure semiconductor film is improved. The present invention is further characterized by the fact that the aforementioned semiconductor film is a silicon film.

In a fabrication process of a thin film semiconductor device having as the active layer of a transistor a semiconductor film, said semiconductor film being formed over an insulating material on the substrate, at least a portion of which is an insulating material; the present invention is characterized by a first step in which a semiconductor film having both amorphous and crystalline components, said amorphous component having a columnar structure, is deposited; and a second step in which said columnar structure semiconductor film is exposed to optical energy or electromagnetic wave energy irradiation. The present invention is further characterized by the fact that the aforementioned semiconductor film is a silicon film.

In a fabrication process of a thin film semiconductor device having as the active layer of a transistor a semiconductor film, said semiconductor film being formed over an insulating material on the substrate, at least a portion of which is an insulating material; the present invention is characterized by a first step in which a semiconductor film having both amorphous and crystalline components, said amorphous component having a columnar structure, is deposited by plasma-enhanced chemical vapor deposition (PECVD); and a second step in which the crystallinity of said columnar structure semiconductor film is improved. The present invention is further characterized by the fact that the aforementioned semiconductor film is a silicon film.

In a fabrication process of a thin film semiconductor device having as the active layer of a transistor a semiconductor film, said semiconductor film being formed over an insulating material on the substrate, at least a portion of which is an insulating material; the present invention is characterized by a first step in which a semiconductor film having both amorphous and crystalline components, said amorphous component having a columnar structure, is deposited by plasma-enhanced chemical vapor deposition (PECVD); and a second step in which said columnar structure semiconductor film is exposed to optical energy or electromagnetic wave energy. The present invention is further characterized by the fact that the aforementioned semiconductor film is a silicon film.

In a fabrication process of a thin film semiconductor device having as the active layer of a transistor a semiconductor film, said semiconductor film having mixed crystallinity and being formed over an insulating material on the substrate, at least a portion of which is an insulating material; the present invention is characterized by the presence of argon (Ar) in the reaction chamber during the growth of said semiconductor film. The present invention is further characterized by the fact that the aforementioned semiconductor film is a silicon film.

In a fabrication process of a thin film semiconductor device having as the active layer of a transistor a semiconductor film, said semiconductor film being formed over an insulating material on the substrate, at least a portion of which is an insulating material; the present invention is characterized by the inclusion of a process step in which a mixed crystallinity semiconductor film is deposited by plasma-enhanced chemical vapor deposition (PECVD) using argon (Ar) as a dilution gas. The present invention is further characterized by the fact that the aforementioned semiconductor film is a silicon film.

In a fabrication process of a thin film semiconductor device having as the active layer of a transistor a semiconductor film, said semiconductor film being formed over an insulating material on the substrate, at least a portion of which is an insulating material; the present invention is characterized by a first step in which a mixed-crystallinity semiconductor film is deposited in an argon (Ar)-containing atmosphere; and a second step in which said mixed-crystallinity semiconductor film is crystallized. The present invention is further characterized by the fact that the crystallization proceeds by way of a brief molten state during the aforementioned second process step and that the aforementioned semiconductor film is a silicon film.

In a fabrication process of a thin film semiconductor device having as the active layer of a transistor a semiconductor film, said semiconductor film being formed over an insulating material on the substrate, at least a portion of which is an insulating material; the present invention is characterized by a first step in which a semiconductor film in a mixed-crystallinity state is deposited under an argon-containing atmosphere; and a second step in which the said semiconductor film in a mixed-crystallinity state is exposed to optical energy or electromagnetic wave energy irradiation. The present invention is further characterized by the fact that the semiconductor film is briefly in a molten state during the aforementioned second process step and that the aforementioned semiconductor film is a silicon film.

In a fabrication process of a thin film semiconductor device having as the active layer of a transistor a semiconductor film, said semiconductor film being formed over an insulating material on the substrate, at least a portion of which is an insulating material; the present invention is characterized by a first step in which a mixed-crystallinity semiconductor film is deposited by plasma-enhanced chemical vapor deposition (PECVD) using argon (Ar) as a dilution gas; and a second step in which said mixed crystallinity semiconductor film is crystallized. The present invention is further characterized by the fact that the semiconductor film is briefly in a molten state during the aforementioned second process step and that the aforementioned semiconductor film is a silicon film.

In a fabrication process of a thin film semiconductor device having as the active layer of a transistor a semiconductor film, said semiconductor film being formed over an insulating material on the substrate, at least a portion of which is an insulating material; the present invention is characterized by a first step in which a mixed-crystallinity semiconductor film is deposited by plasma-enhanced chemical vapor deposition (PECVD) using argon (Ar) as a dilution gas; and a second step in which the said semiconductor film in a mixed-crystallinity state is exposed to optical energy or electromagnetic wave energy irradiation. The present invention is further characterized by the fact that the semiconductor film is briefly in a molten state during the aforementioned second process step and that the aforementioned semiconductor film is a silicon film.

The liquid crystal display devices of the present invention are characterized by the incorporation of a thin film semiconductor device as described above. Further, the electronic devices of the present invention are characterized by the incorporation of such a liquid crystal display device.

In a fabrication process of a liquid crystal display device which holds liquid crystal between two substrates, one of which incorporates a thin film semiconductor device consisting of a semiconductor film formed over an insulating material of the substrate, at least a portion of the surface of which is an insulating material; and said semiconductor film serving as the active layer of a transistor; the present invention is characterized by a first step in which a semiconductor film is deposited by plasma-enhanced chemical vapor deposition (PECVD) using a chemical specie containing constitutive elements of said semiconductor film as the source gas and, moreover, using argon (Ar) as an additional gas; and a second step in which the crystallinity of said semiconductor film is improved.

In the fabrication process of an electronic device having a liquid crystal display device which holds liquid crystal between two substrates, one of which incorporates a thin film semiconductor device consisting of a semiconductor film formed over an insulating material of the substrate, at least a portion of the surface of which is an insulating material; and said semiconductor film serving as the active layer of a transistor; the present invention is characterized by a first step in which a semiconductor film is deposited by of plasma-enhanced chemical vapor deposition (PECVD) using chemical species containing constitutive elements of said semiconductor film as source gases and, moreover, using argon (Ar) as an additional gas; and a second step in which the crystallinity of said semiconductor film is improved.

In a process for depositing a thin film over a substrate by plasma enhanced chemical vapor deposition (PECVD); the present invention is characterized by a first step in which a substrate is set in a reaction chamber; a second step, performed after loading of said substrate, and consisting of the introduction of gases into said reaction chamber, said gases having a higher thermal conductivity than gases introduced into said reaction chamber at the time of deposition; and a first preheating of said substrate; a third step consisting of a second preheating of said substrate, all conditions of the second preheating being the same as the deposition process, with the exception of the generation of plasma; and a fourth step in which deposition of a thin film is then attempted.

In a process for depositing a thin film over a substrate by plasma-enhanced chemical vapor deposition (PECVD); the present invention is characterized by a first step in which a substrate is set in a reaction chamber; a second step, performed after loading of said substrate, and consisting of the maintenance of said reaction chamber at a pressure higher than that at the time of deposition; and a first preheating of said substrate; a third step consisting of a second preheating of said substrate, all conditions of the second preheating being the same as the deposition process, with the exception of the generation of plasma; and a fourth step in which deposition of a thin film is then attempted.

In a process for depositing a thin film over a substrate by plasma enhanced chemical vapor deposition (PECVD); the present invention is characterized by a first step in which a substrate is set in a reaction chamber; a second step, performed after loading of said substrate, and consisting of the introduction of gases into said reaction chamber, said gases having a higher thermal conductivity than gases introduced into said reaction chamber at the time of deposition, at a pressure higher than that at the time of deposition; and a first preheating of said substrate; a third step consisting of a second preheating of said substrate, all conditions of the second preheating being the same as the deposition process, with the exception of the generation of plasma; and a fourth step in which deposition of a thin film is then attempted.

The fundamental principles and forms of execution of the present invention will be explained with reference to the following drawings. FIGS. 3(a) through (d) are cross sectional schematic representations of the fabrication process for thin film semiconductor devices constituting an MIS field effect transistor. After giving an outline of the TFT fabrication process in the present invention using these figures, the details of each processing step will be explained.

(1, Outline of the Fabrication Procedure of a Thin Film Semiconductor Device of the Present Invention)

In the present invention, a conventional non-alkaline glass is used as an example for substrate 101. First, an insulating underlevel protection layer 102 is formed over substrate 101 by a technique such as atmospheric pressure chemical vapor deposition (APCVD), PECVD, or sputtering. Next, a semiconductor layer such as intrinsic silicon, which will later become the active layer of the semiconductor device, is deposited. The semiconductor layer can be formed by chemical vapor deposition (CVD) such as PECVD or APCVD or by physical vapor deposition (PVD) such as sputtering or evaporation. Semiconductor layers so fabricated can be used in the as-deposited condition as the active layer in the TFT channel region, or can be crystallized by short-time irradiation using electromagnetic energy or optical energy such as from laser light.

When the originally deposited semiconductor layer is amorphous or a mixture of amorphous and microcrystalline material, this process is known as crystallization. On the other hand, if the originally deposited semiconductor layer is polycrystalline, the process is known as recrystallization. In this specification of the present invention, both are simply referred to as "crystallization" or "a process which improves the crystallinity" unless it is necessary to make a distinction. If the energy from laser light or other source is high, the semiconductor layer will crystallize by initially melting and then solidifying upon cooling. This is known as melt crystallization in the present invention. Conversely, crystallization in which the semiconductor layer does not melt but proceeds in the solid state is known as solid phase crystallization (SPC).

Solid phase crystallization can be divided mainly into three types: furnace-SPC in which crystallization occurs at temperatures from 550° C. to 650° C. for times ranging from a few hours to several tens of hours, rapid thermal annealing (RTA) in which crystallization occurs in a very short time frame ranging from less than one second up to about one minute at temperatures of 700 to 1000° C., and very short time-SPC (VST-SPC) using low energy such as from a laser. Although all three types are suitable for use in the present invention, melt crystallization, RTA and VSTSPC are particularly appropriate when considered in light of processing which allows high productivity for large substrates. The reason for this is that in these crystallization methods, the irradiation time is extremely short and the whole substrate is not heated simultaneously to a high temperature during crystallization of the semiconductor layer since the irradiated area is localized with respect to the entire substrate area; and, therefore, no heat-induced deformation or cracking of the substrate occurs. Following crystallization, the semiconductor layer is patterned; and then semiconductor layer 103, which will become the active layer of the transistor, is produced. [FIG. 3(a)]

After formation of the semiconductor layer, the gate insulator layer 104 is formed by a method such as CVD or PVD. [FIG. 3(b)] Several methods can be considered for the fabrication of insulating films, but a fabrication temperature of 350° C. or less is desirable. This is essential to avoid thermal degradation of the MOS interface and the gate insulator film. This is applicable to subsequent steps in the fabrication process as well. Processing temperatures following fabrication of the gate insulator layer must be kept at or below 350° C. Doing so allows high performance semiconductor devices to be produced both easily and reliably.

Now, in general, the film quality of oxide layers fabricated by methods such as CVD or PVD is inferior to films fabricated by thermal oxidation in which the semiconductor layer is heated to around 1000° C. or higher. For example, the main absorption peak from the O—Si—O stretching mode measured by infrared absorption spectroscopy appears around 1080 $cm^{-1}$. For high quality thermal oxide films, this main absorption peak appears around 1086±10 $cm^{-1}$ with a full width at half maximum of 80±10 $cm^{-1}$ and an absorption coefficient on the order of 33400±4000 $cm^{-1}$. In contrast, the main absorption peak for oxide layers fabricated by CVD or PVD methods appears at 1070±10 $cm^{-1}$ with a full width at half maximum of 108±10 $cm^{-1}$ and an absorption coefficient of 24000±3000 $cm^{-1}$.

Consequently, processing to improve film quality following deposition is desirable for inferior oxide layers fabricated by CVD or PVD methods. Specifically, thermal processing of the oxide layer at a temperature between approximately 200° C. and 400° C. is carried out for a time ranging from about 10 minutes to 5 hours in an oxidizing atmosphere having an oxygen partial pressure of from approximately 0.1 atmospheres to 3 atmospheres and also containing water vapor, with a dew point of from approximately 20° C. to 100° C., as a catalyst for the reaction which improves the quality of the oxide layer.

For example, in the as-deposited condition, a oxide layer fabricated by PECVD using monosilane ($SiH_4$) and nitrous oxide ($N_2O$) as the source gases shows a main absorption peak around 1068 $cm^{-1}$ with a full width at half 1 maximum of about 110 $cm^{-1}$ and an absorption coefficient of 23600 $cm^{-1}$. Annealing this oxide film at approximately 350° C. under an atmosphere having an oxygen partial pressure of approximately 0.2 atmospheres and containing water vapor with a dew point around 80° C. for roughly 3 hours, the film improves to one which has a main absorption peak around 1077 $cm^{-1}$ and a full width at half maximum of about 95 $cm^{-1}$ and an absorption coefficient on the order of 27500 $cm^{-1}$. Although the film quality of this layer is slightly inferior to that of a thermal oxide layer, it is a good quality film for an oxide layer deposited by a low temperature process of 350° C.

In such a fashion, when fabricating a oxide layer by a low temperature process, annealing in an oxidizing environment following oxide layer deposition is extremely effective. Additionally, when fabricating the semiconductor layer of a thin film semiconductor device over an underlevel protection layer, it is also desirable to anneal this oxide layer in an oxidizing environment containing water vapor.

Next, a thin film which will become the gate electrode 105 is deposited by a method such as PVD or CVD. Since the same material is usually used for both the gate electrode and the gate interconnects and both are fabricated in the same step, it is desirable to use a material which has low electrical resistance and is stable with respect to thermal processing around 350° C. After deposition of the thin film for the gate electronic, patterning and then ion implantation 106 into the semiconductor layer is employed to form the source and drain regions 107 and the channel region 108. [FIG. 3(c)]

During this process, the gate electrode acts as a mask for ion implantation so that the channel is formed only underneath the gate in a self-aligned structure. For impurity ion incorporation, both ion doping, in which non-mass separation equipment is used and hydrogenated impurity species as well as hydrogen are incorporated into the film, and ion implantation, in which mass-separation ion implanters are used and only the desired impurities themselves are incorporated into the film, are applicable. Source gases for ion doping use hydrogenated species of the impurity ions such as phosphine ($PH_3$) and diborane ($B_2H_6$) which are diluted in hydrogen to concentrations of 0.1% to 10%. In the case of ion implantation, hydrogen ions (protons or molecular hydrogen ions) are implanted following the implantation of the desired impurity elements by themselves.

In order to maintain a stable MOS interface and gate insulator layer, the temperature must be kept at or below 350° C. for both ion doping and ion implantation. On the other hand, in order to always reliably carry out the impurity activation at a low temperature of 350° C. or less (this is known as low temperature activation in the present application), it is desirable to keep the substrate temperature above 200° C. during implantation.

To ensure a low temperature activation of impurity ions implanted in the channel to control the transistor threshold voltage or impurity ions implanted in lightly doped regions such as those used to form an LDD structure, it is necessary to keep the substrate temperature at or above 250° C. during ion implantation. The result is that amorphization of the ion implanted region can be avoided by performing the ion implantation at such a high substrate temperature since recrystallization occurs simultaneously with damage to the semi-conductor layer. In other words, the ion implanted region remains crystalline following implantation, and the subsequent activation of the implanted ions can still be achieved even using a low activation annealing temperature of less than about 350° C. When fabricating a CMOS TFT, the NMOS or PMOS region is alternately covered by a suitable mask material such as a polyimide, and ion implantation in the appropriate region is performed using the procedure above.

Next, the interlevel insulator film 109 is formed by either CVD or PVD. Following ion implantation and interlevel insulator film formation, ion activation and interlevel insulator film densification are carried out by thermal annealing in a suitable thermal environment at temperatures less than about 350° C. for a time ranging from several tens of minutes to a few hours. It is possible for this annealing to be performed using the same conditions employed for the annealing in the water vapor-containing oxidizing environment following deposition of the gate insulator layer. It is desirable, however, for this annealing temperature to be greater than approximately 250° C. to ensure activation of the implanted ions. Additionally, for effective densification of the interlevel insulator film, a temperature of 300° C. or higher is preferred.

The film quality of the gate insulator layer and the interlevel insulator layer are normally different. Accordingly, during the opening of contact holes in the two insulator films following interlevel insulator film formation, it is common for the etching rates in the two films to be different. Under such conditions, an inverse taper in which the bottom of the contact hole is wider than the top or the formation of a canopy can result. During electrode formation, these undesirable structures can be causes of poor contact between the electrode and underlying layers in the device leading to so-called "contact failure." The generation of contact failure can be minimized by effective densification of the interlevel insulator film. Following formation of the interlevel insulator layer, contact holes are opened above the source and drain regions; and source and drain electrodes 110 and interconnects are formed by PVD or CVD to complete the fabrication of the thin film semiconductor device. [FIG. 3(d)]

Although a thin film semiconductor device having a gate electrode on the top side of the semiconductor layer has been explained as an example in this section, the present invention can also be applied to a thin film semiconductor device which has the gate electrode on the bottom side of the semiconductor layer.

(2, Detailed Explanations of the Individual Steps in the Fabrication Process of the Thin Film Semiconductor Device of the Present Invention)

(2-1, Substrates and Underlevel Protection Layers Suitable for the Present Invention)

First, substrates and underlevel protection layers suitable for the present invention will be explained. For the present invention, substrates including conductive materials such as metals; ceramic materials such as silicon carbide (SiC), alumina ($Al_2O_3$), and aluminum nitride (AlN); transparent insulating materials such as fused quartz and glass; semiconductor substrates such as silicon wafers or processed LSI; and crystalline insulators such as sapphire (trigonal $Al_2O_3$ crystals) can be used. Low priced conventional glass substrates which can be used include Corning Japan's 7059 and 1737 glasses, Nippon Electric Glass Co., Ltd.'s OA-2 glass, and NH TechnoGlass's NA35. The type of substrate is immaterial for the semiconductor film; and, as long as least part of the substrate surface is composed of an insulating material, the semiconductor layer can be deposited over the insulating material.

This insulating material is known as the underlevel protection layer in the present invention disclosure. For example, if a fused quartz substrate is used as a substrate, it is acceptable to deposit a semiconductor filing directly over the fused quartz substrate since the substrate itself is insulating. Or, it is acceptable to deposit the semiconductor film on top of an underlevel protection layer such as silicon oxide ($SiO_x$:0<x£2) or silicon nitride ($Si_3N_x$:0<x£4) which has been formed over the quartz substrate. When using an ordinary glass substrate, it is possible to deposit the semiconductor film directly over the insulating glass; but it is desirable to deposit the semiconductor film after the formation of an insulating underlevel protection layer such as silicon oxide or silicon nitride to avoid penetration of mobile ions like sodium (Na), which are contained in the glass substrate, into the semiconductor film. By so doing, the operational properties of the semiconductor device do not vary under operation over a long time period or under high voltages, and the stability is increased. In the present invention, this stability is called transistor reliability.

With the exception of using crystalline insulating materials such as sapphire as substrates, it is desirable to deposit the semiconductor film over an underlevel protection layer. When using any type of ceramics as a substrate, the underlevel protection layer serves to prevent sintering aids added to the ceramics from diffusing into the semiconductor regions. In the case of metallic substrates, the use of an underlevel protection layer is essential to maintain the insulating properties. Further, with semiconductor substrates or LSI elements, interlevel insulator films between transistors or between interconnects serve the role of underlevel protection layers.

The substrate size and shape adds no additional restrictions as long as the substrates do not shrink or distort in the thermal environment during processing. Substrates can be anywhere on the order of 3 inch diameter (76.2 mm) disks to 560 mm×720 mm rectangular plates.

After the substrate has been cleaned in deionized water, an underlevel protection layer of an oxide such as silicon oxide, aluminum oxide, or tantalum oxide; or a nitride such as silicon nitride is formed on the substrate by CVD methods such as APCVD, LPCVD, or PECVD; or by PVD methods. Using APCVD, it is possible to deposit a silicon oxide film using monosilane ($SiH_4$) and oxygen as source gases at a substrate temperature of 250 to 450° C. PECVD and sputtering can form underlevel protection layers at substrate temperatures between room temperature and approximately 400° C.

It is necessary to have a sufficiently thick underlevel protection layer to prevent the diffusion of impurity ions from the substrate into the semiconductor device, and this thickness is on the order of 100 nm as a minimum. Considering variations from lot to lot or from wafer to wafer within a single lot, it is better to have a thickness greater than 200 nm; and, if the thickness is 300 nm, the film can function sufficiently as a protection layer. When the underlevel protection layer also serves as an interlevel insulator layer between IC elements or the interconnects connecting such elements, a thickness of from 400 to 600 nm is common.

(2-2, Semiconductor Films in the Present Invention and the Source Gases used to Grow Them)

In the present invention, semiconductor films are deposited on some type of substrates. This is a feature common to all the following inventions. In addition to being applicable to single clement films such as silicon (Si) and germanium (Ge), the following types of semiconductor films are also possible: group IV compound semiconductor films such as silicon germanium ($Si_xGe_{1-x}$:0<x<1), silicon carbide ($Si_xC_{1-x}$:0<x<1), and germanium carbide ($Ge_xC_{1-x}$:0<x<1); III-V compound semiconductor films such as gallium arsenide (GaAs), and indium antimonide (InSb); II-VI compound semiconductor films such as cadmium selenide (CdSe). The present invention is also applicable to higher compound semiconductor films such as silicon germanium gallium arsenide ($Si_xGe_yGa_zAs_z$: x+y+z=1) as well as N-type semiconductor films in which donor elements such as phosphorous (P), arsenic (As), or antimony (Sb) have been added and P-type semiconductors in which acceptor elements such as boron (B), aluminum (Al), gallium (Ga), and indium (In) have been added.

When semiconductor films are deposited by CVD in the present invention, the films are deposited using as source gases chemical species containing the constitutive elements of the films. For example, when the semiconductor film is silicon (Si), a silane such as monosilane ($SiH_4$), disilane ($Si_2H_6$), trisilane ($Si_3H_8$), or dichlorosilane ($SiH_2Cl_2$) is used as a source gas. In the present patent specification, disilane and trisilane are called higher silanes ($Si_nH_{2n+2}$: n is an integer greater than or equal to 2). If germanium (Ge) is the semiconductor film, germane (GeH4) is used; and when carbon (C) is used or gallium (Ga) or arsenic (As) is made into a semiconductor, gases such as methane ($CH_4$), trimethylgallium (($CH_3$)$_3$Ga) or arsine ($AsH_3$) are used. Also, phosphine ($PH_3$) and diborane ($B_2H_6$) can be used in addition if phosphorous (P) or boron (B) are to be added to the semiconductor film.

Although chemical species containing the constitutive elements of the various types of semiconductor films mentioned above can be used as source gases, it is preferable to use hydrogenated species to the constitutive elements since some of the source gases will always be incorporated into the semiconductor film. For example, silicon films grown from dichlorosilane ($SiH_2Cl_2$) will always contain some chlorine (Cl) whether in small or large amounts; and this incorporated Cl can be a factor in the degradation of transistor properties when the silicon film is used as the active layer in a thin film semiconductor device. Therefore, monosilane ($SiH_4$), a hydrogenated form of the constituent element, is preferable over dichlorosilane.

As high a purity as possible for the source gases, and dilution gases if need be, is desirable. Considering that costs increase as the technological difficulties in producing high purity gases grow, a purity of 99.9999% or higher is desirable. The background pressure of common semiconductor film deposition equipment is on the order of $10^{-6}$ torr, and the process pressure is from 0.1 torr to a few torr. Therefore, the ratio of the incorporation of impurities from the background pressure in the film growth step is on the order of $10^{-5}$ to $10^{-6}$. The purity of the source or dilution gases is sufficient if it is equivalent to the ratio of the process pressure to the background pressure of the equipment using the gases. As a result, a purity of 99.999% or more (impurity ratio of $1\times10^{-5}$ or less) for gases flowing in the deposition equipment is desirable in the present invention. If the purity is 99.9999% (impurity ratio of $1\times10^{-6}$ or less), there is absolutely no problem as use as a source gas; and, in the ideal case in which the purity is ten times that of the ratio of the background pressure to the process pressure (99.99999% in the present example; impurity ratio of $1\times10^{-7}$ or less), the incorporation of impurities from the gases need not even be considered.

(2-3, PECVD Reactor used in the Present Invention)

First, FIG. 2 will be used to describe the general configuration of the plasma enhanced chemical vapor deposition reactor (PECVD reactor) used in this invention. The PECVD reactor is a single substrate capacitively-coupled type, and the plasma is generated between parallel plate electrodes using an industrial frequency (13.56 MHz) high frequency power supply. The top drawing in FIG. 2 is an overall perspective of the reaction chamber vicinity as viewed from above, and a drawing of cross section A–A' is shown in the bottom of FIG. 2.

Reaction chamber 201 is isolated from the outside by reaction vessel 202, which is in a reduced pressure condition of from about 0.1 torr to 10 torr during film formation. Inside of reaction vessel 202, lower plate electrode 203 and upper plate electrode 204 are placed in mutually parallel positions. These two electrodes form the parallel plate electrodes. The space between these parallel plate electrodes is reaction chamber 201. This invention uses 470 mm×560 mm parallel plate electrodes.

Since the distance between the electrodes is variable from 18.0 mm to 37.0 mm, the volume of reaction chamber 201 varies from 4738 cm³ to 9738 cm³ depending on the distance between the electrodes. The distance between the parallel plate electrodes can be set freely between 10.0 mm and 40.0 mm by moving the position of lower electrode 203 up and down. Moreover, when set to a designated electrode distance, the deviation of the electrode distance over the 470 mm×560 mm plate electrode surfaces is a mere 0.5 mm. As a result, the deviation in the electrical field strength that appears between the electrodes is 2% or less over the plate electrode surfaces; and an extremely uniform plasma is generated within reaction chamber 201.

Substrate 205 on which thin film deposition is to take place is placed over lower plate electrode 203 and 2 mm of the substrate edge is held down by shadow frame 206. Shadow frame 206 has been omitted from the upper drawing of FIG. 2 to make the overall drawing of the PECVD reactor easy to understand.

Heater 207 is installed within lower plate electrode 203. The temperature of lower plate electrode 203 can be adjusted as desired from 250° C. to 400° C. Except for the peripheral 2 mm, the temperature distribution within lower plate electrode 203 is within ±5.0° C. relative to the set-point temperature. Essentially, even if the size of substrate 205 were 360 mm×465 mm, the temperature deviation within the substrate can be maintained to within ±2° C. For example, if a conventional glass substrate (such as Corning Japan's #7059, Nippon Electric Glass Co., Ltd.'s OA-2, or NH TechnoGlass's NA35) were used as substrate 205, shadow frame 206 would hold substrate 205 down to prevent it from deforming concavely by the heat from heater 207 as well as to prevent unnecessary thin films from being formed on the edges and back surface of the substrate.

The reaction gas, which is made up of source gases and additional gases, flows through tube 208 and is introduced in an upper plate electrode 204. It then flows between gas diffusion plates 209 located inside upper plate electrode 204, and flows from the entire surface of the upper plate electrode into reaction chamber 201 at a virtually uniform pressure. If film formation is taking place, some of the reaction gas will be ionized when it exits the upper plate electrode and cause a plasma to be generated between the parallel plate electrodes. From a part to all of the reaction gas will participate in film formation.

Residual reaction gas that has not participated in film formation and gases formed as a result of the film-forming chemical reaction will become exhaust gases and be discharged through exhaust port 210 which is in the top of the peripheral section of reaction vessel 202. The conductance of exhaust port 210 is sufficiently large compared to the conductance between the parallel plate electrodes. The desired value is one that is 100 times or more to the conductance between the parallel plate electrodes. In addition, the conductance between the parallel plate electrodes is also sufficiently larger than the conductance of gas diffusion plate 209; and that desired value is also 100 times or more of the conductance of gas diffusion plate 209.

Through such a configuration, reaction gas can flow into the reaction chamber at essentially a uniform pressure from the entire surface of the large 470 mm×560 mm upper plate electrode; and, at the same time, exhaust gases will be discharged in all directions from the reaction chamber in an even flow. The flow rates of the various reaction gases will be adjusted to their designated values by mass flow controllers prior to entering tube 208. In addition, the pressure within reaction vessel 202 will be adjusted to the desired value by conductance valve 211, which is located at the exit of the exhaust port.

A pumping system, such as a turbomolecular pump, is located on the exhaust side of conductance valve 211. In this invention, an oil-free dry pump is used as part of the pumping system, and the background pressure within reaction vessels such as the reaction chamber is set to the $10^{-5}$ torr level. In FIG. 2, arrows are used to show the general flow of the gas. Both reaction vessel 202 and lower plate electrode 203 are at ground potential. These and upper plate electrode 204 are electrically isolated by insulation ring 212. When a plasma is generated, for example, 13.56 MHz high frequency waves that are generated from high frequency oscillation supply 213 are applied to upper plate electrode 204 through impedance matching circuit 214.

As stated above, because the PECVD reactor used in this invention has very sophisticated inter-electrode interval control and uniform gas flow, it is a thin film formation reactor that is able to handle large substrates of 360 mm×465 mm in size. However, by merely adhering to these basic concepts, it can easily handle further enlargements in the substrate. Actually, it is possible to produce a reactor that can handle even larger substrates of 550 mm×650 mm. In addition, although in this invention the most common 13.56 MHz high wave frequency was used, whole number multiples of this frequency may also be used. For example, a double frequency of 27.12 MHz, a triple frequency of 40.68 MHz, a quadruple frequency of 54.24 MHz, and others are also effective. Additionally, VHF waves from 100 MHz to 1 GHz may be used. If the rf frequency is from 10 MHz to several hundred MHz (VHF), it is possible to get generate a plasma between the parallel plate electrodes. Therefore, by changing high frequency oscillator supply 213 and impedance matching circuit 214 of the PECVD reactor used in this invention, a plasma using electromagnetic waves of a desired frequency can be easily generated.

In general for a high frequency plasma, if the frequency is increased, the electron temperature within the plasma will increase and radicals can be easily created. For this reason, as will be explained later, this is particularly effective for the thin film formation method of the present invention.

(2-4, Semiconductor Films in the Present Invention and their Deposition using PECVD)

The semiconductor film of the thin film semiconductor device of the present invention and the method of forming the film using the PECVD process will be described. After forming the underlevel protection layer on at least a portion of the substrate surface using an insulating material, such as a silicon oxide film, a semiconductor film is formed over this underlevel protection layer. Ultimately, a thin film semiconductor device that uses the semiconductor film as the transistor's active layer will be fabricated.

The substrates are set in the PECVD reactor in which the temperature of the lower plate electrode 203 is maintained at 380° C. Except for exciting the plasma, the PECVD reactor conditions are set identically to those used during the film growth process. For example, the monosilane flow rate is set at 50 SCCM, the argon flow rate is set at 3000 SCCM, and the pressure inside the reaction chamber is held at 1.5 Torr. The parallel plate electrode separation distance is 24.4 mm. The substrate surface temperature was 349° C. after the substrates had reached equilibrium under these conditions. The time from when the substrates are set in the PECVD reactor until equilibrium is reached is known as the equilibration time. For substrates held at room temperature, an equilibration time of five to six minutes at a minimum is necessary.

Naturally, the equilibration time varies depending on the substrate thickness, heat capacity, thermal conductivity, the substrate temperature prior to setting in the reactor, as well as the type of gases introduced into the reaction chamber, their flow rates, pressures, etc. If the substrate thickness is reduced from the 1.1 mm used in the present invention to 0.7 mm, for example, the equilibration time can be decreased nearly proportionally to three to four minutes. If the substrates are preheated prior to being set in the reaction chamber, it is again possible to decrease the equilibration time. Particularly, if the substrates are preheated at a temperature approximately 10° C. higher than the substrate surface temperature reaches in equilibrium, it is possible to achieve an equilibration time on the order of one minute.

It goes without saying that a decrease in equilibration time means an increase in throughput and a decrease in product prices. Also, in general, the substrate surface temperature at equilibrium decreases if the pressure in the reaction chamber is low. Consequently, following a first preheating during the initial several tens of seconds to several minutes after the substrates have been set in which a gas with a higher thermal conductivity (such as hydrogen or helium) than the gas introduced into the reaction chamber during film growth is introduced into the reaction chamber, or in which the reaction chamber is maintained at a higher pressure than it is during film growth, or in which a combination of these two conditions in which a gas with a higher thermal conductivity than the gas introduced into the reaction chamber during film growth is introduced into the reaction chamber which is held at a pressure higher than that used for film growth and a second preheating lasting for an additional several tens of seconds to several minutes during which the various process conditions mentioned above (type of gas introduced, gas flow rate, reaction chamber pressure, parallel plate electrode separation distance, lower plate electrode temperature) are identical to those used during film growth with the exception of plasma excitation; film growth may be attempted.

It is desirable for the second preheating to spend enough time to completely replace the atmosphere in the reaction chamber of the first preheating with the atmosphere of the second preheating. Even considering a perfect mixture with the slowest exhaust rate in time t (min) during the second preheating period, expressing the ratio of residual gas components from the first preheating as x, the reaction chamber volume as V (cc), the pressure during deposition as P (Torr), and the gas flow rate during deposition as Q (sccm), t can be expressed as $$t = -(P/760) \times (V/Q) \times 1n\,(x).$$

Defining complete replacement as $x=10^{-6}$, the expression can be rewritten as $$t = (P/760) \times (V/Q) \times 13.82.$$

Therefore, by extending the second preheating by an amount given by t (min) calculated from this equation, the reaction chamber atmosphere can be completely replaced with the atmosphere of the second preheating. By so doing, the gases introduced during the first preheating do not remain during semiconductor film deposition, and it is possible to always maintain an identical atmosphere during semiconductor film deposition.

Additionally, the substrate temperature during film growth resulting from the second preheating can be fixed. As a result, the atmosphere and the temperature of the second preheating are stabilized which leads to the deposition of a uniform film in terms of film thickness. Additionally, it is possible to decrease the equilibration time all the more.

After equilibration has been reached in this manner, high frequency is applied to the upper plate electrode to generate the plasma and semiconductor film growth occurs. The high frequency power is 600 W, for example. An example of silicon deposition conditions is as shown below.

Silane flow rate: $SiH_4$=50 SSCM

Argon flow rate: Ar=3000 SCCM (source concentration 1.64%)

High frequency power: RF=600 W (0.228 W/cm$^2$)

Pressure: P=1.5 Torr

Electrode separation: S=24.4 mm

Lower plate electrode temperature: Tsus=380° C.

Substrate surface temperature: Tsub=349° C.

The deposition rate under the given conditions was 0.327 nm/sec, and the hydrogen concentration of the silicon film measured by thermal desorption spectroscopy (TDS) was 9.10 atomic %. Transmission electron microscopy observation revealed that the silicon film had both amorphous and crystalline components with the amorphous components having mainly a columnar structure. The crystalline components are islands interspersed among the columnar amorphous components.

FIG. 7 shows the results of Raman spectroscopy on these silicon films. A peak which is not seen for silicon films of the prior art as shown in FIG. 6 can be seen in the neighborhood of 520 cm$^{-1}$. This is the Raman shift from the crystalline component contained within the silicon films. That is, the silicon films obtained from the present invention are of mixed crystallinity having both amorphous and crystalline components.

The infrared absorption spectrum for these silicon films is shown in FIG. 4. In comparison to the results for prior a-Si films (FIG. 5), two clearly separated absorption peaks appear near 2102 cm$^{-1}$ (peak location runs from about 2098 cm$^{-1}$ to 2106 cm$^{-1}$) and 2084 cm$^{-1}$ (peak location runs from about 2080 cm$^{-1}$ to 2088 cm$^{-1}$), and it can be seen that the intensity of the absorption peak near 2102 cm$^{-1}$ is stronger than the intensity of the absorption peak near 2000 cm$^{-1}$ (peak location runs from about 1980 cm$^{-1}$ to 2020 cm$^{-1}$). The absorption peak at 2000 cm$^{-1}$ is the stretching mode of hydrogen bound to a-Si (Si—H). Previously, stretching modes for hydrogen bonded to silicon as ($SiH_2$) or ($SiH_2)_n$ apparently have appeared near 2090 cm$^{-1}$ (references: M. H. Brodskey, M. Cardona and J. J. Cuomo, Phys. Rev. B 16 (1977) 3556 and G. Lucovskey, R. J. Nemanich and J. C. Knights, Phys. Rev. B 19 (1979) 2064).

In the present case, however, based on the fact that the peaks at 2102 cm$^{-1}$ and 2084 cm$^{-1}$ are considerably stronger than the peak at 2000 cm$^{-1}$; the fact that there is a large crystalline component in the semiconductor film; the fact that when the growth conditions are changed such that the fraction of crystalline component increases, the peak at 2000 cm$^{-1}$ decreases while the peaks at 2102 cm$^{-1}$ and 2084 cm$^{-1}$ simultaneously increase; the fact that when using TDS to measure the amount of liberated hydrogen as the semiconductor sample is heated, in contrast to samples which show the normal 2000 cm$^{-1}$ peak and have the largest liberation of hydrogen for sample temperatures around 300° C., the samples in the present system produce large amounts of hydrogen around 370° C.; the peaks which appear at 2102 cm$^{-1}$ and 2084 cm$^{-1}$ are unique to this system, and seem to be a result of vibrations of hydrogen bound to the crystalline components in the mixed crystallinity films having both amorphous and crystalline components. Additionally, because two distinctly separate absorption peaks at 2102 cm$^{-2}$ and 2084 cm$^{-1}$ do not appear for previous microcrystalline silicon (hydrogen-based microcrystalline silicon) deposited by PECVD using hydrogen as a dilution gas, it can be said that the two peaks are peculiar to argon-based deposited silicon. Put another way, the peaks at 2102 cm$^{-2}$ and 2084 cm$^{-1}$ appear most readily for mixed crystallinity films deposited using argon as a dilution gas.

Ultimately, silicon films deposited by PECVD using silane, which contains the constitutive element of silicon in the semiconductor film, as a source gas and argon as a carrier gas are mixed crystallinity films which contain mostly columnar amorphous components. Additionally, these semiconductor films contain from about 1% to 10% hydrogen bonded to amorphous silicon and crystalline silicon, and these peaks can be observed near 2102 cm$^{-2}$ and 2084 cm$^{-1}$. And, since halogen species such as tetrafluorosilane ($SiF_4$) are not used during deposition, halogen elements are not at all incorporated into the semiconductor films obtained from the present system resulting in extremely high-purity films. For the sake of brevity, these semiconductor films are abbreviated as (Ar)—mixed-crystallinity films in the sections that follow.

The (Ar)—mixed-crystallinity semiconductor films obtained through the present invention as described can be used as the active layer (namely, source and drain regions, channel region, or emitter and collector regions, or base region) in thin film semiconductor devices in the as-deposited condition without the use of a special crystallization step. Because the semiconductor films of the present invention are high-purity as mentioned above and contain large amounts of crystalline regions within the amorphous regions and because the less than approximately 10% hydrogen terminates defects and dangling bonds in the amorphous and crystalline regions, thin film semiconductor devices fabricated using these semiconductor films show good electrical characteristics with mobilities of 2 cm$^2 \times$V$^{-1}$ sec$^{-1}$ or more.

Further, the semiconductor films in the present invention reflect these good film qualities, and it is possible to fabricate MOS-type TFTs using the process described previously in (1, Outline of the Fabrication Procedure of a Thin Film Semiconductor Device of the Present Invention). In other words, even without a special crystallization step, ion implantation and subsequent low temperature activation anneal at approximately 350° C. are possible and applicable to the fabrication method of Section 1. Since the maximum processing temperature of that fabrication method is around 350° C., self-aligned thin film semiconductor devices can be formed easily over substrates which have low thermal tolerance such as common, large glass.

In the thin film semiconductor devices of the present invention, because the overlap between the gate electrode and the source and drain regions is small, the parasitic capacitances between the gate and source and between the gate and drain are small. As a consequence, the operating speed of circuits composed using thin film semiconductor devices of the present invention can be increased. Additionally, if the thin film semiconductor devices are used in switching elements for AMLCDs, it is possible to decrease the storage capacitor by improved precision and both of these improvements can lead to the realization of a liquid crystal display with good picture quality and the possibility of a high aperture ratio display.

There are five important parameters during the deposition of such good quality semiconductor films by PECVD. These are the type of additional gas, the flow rate ratio of these gases [the concentration with respect to the source gas (such as monosilane) to the total (the sum of the additional gas (such as argon) and the source gas)], pressure, electrode separation distance, and substrate surface temperature. These factors will next be explained below.

One of the characteristics of this invention is that a film deposited by highly conventional PECVD is a mixed-crystallinity film with a relatively high degree of crystallinity immediately after deposition (an as-deposited film). It is extremely difficult to make a mixed-crystallinity film with a high degree of crystallinity in an as-deposited film using normal PECVD processing. Since the substrate temperature is less than 400° C., the mobility of source materials such as silane on the surface of the growing film decreases; and the selectivity of the source material for the crystalline state as opposed to the amorphous state is lost. Because of this, previously fluorosilane was introduced during film growth but was feared to lead to the decrease in semiconductor layer purity. This invention eliminates this deficiency in the PECVD method by introducing a large amount of an additional gas such as argon (Ar) and diluting the source materials with the additional gas.

To form a mixed-crystallinity film with a high degree of crystallinity in the as-deposited state, radicals and ions of argon (Ar) must be generated, without generating radicals and ions of the source materials, and carry energy to the surface of the substrate. Because radicals and ions of source materials cause vapor phase reactions or react the instant they arrive at the substrate surface, selectivity is lost, thereby preventing crystal growth at the surface of the semiconductor film. For these reasons, the generation of such radicals and ions within a plasma must be avoided at all costs. The source materials are carried to the surface of the growing film in an inactive state and become adsorbed there. Subsequently, if energy for reaction is supplied, such as by a dilution gas, a mixed-crystallinity film with a high degree of crystallinity will be formed in the as-deposited state.

Consequently, dilution of the source gas is desired, and this gives rise to the necessity of selecting as the dilution gas a gas that promotes reaction of the source materials on the substrate surface. It goes without saying that argon is composed of individual atoms, and, for this reason the ionization potential spectrum is very simple. The first ionization potential of argon is 15.759 eV, while the second ionization potential is 27.629 eV, and the third ionization potential is 40.74 eV. Therefore, when a small amount of source material is diluted in argon and a plasma is generated, both the monovalent ions and divalent ions are dominant; and, as a result of the relatively low ionization energy, argon radicals and ions are generated.

In contrast to this, there is hydrogen, widely used as a dilution gas in the prior art, in which more than ten different ionization potentials exist between 15 eV and 18 eV for the ionization potential of the hydrogen molecules. For this reason, in contrast to argon which forms plasmas containing one or two energies (laser light if referred to in terms of light), molecular gases such as hydrogen form plasmas containing a mixture of energies (white light if referred to in terms of light).

Just as laser light will transport energy more effectively than white light, energy is transported to the substrate surface more effectively when the source gas is diluted by argon which has a low ionization potential. In addition to argon, noble gases such as helium (He), neon (Ne), krypton (Kr) and xenon (Xe) may of course also be used as dilution materials during the deposition of semiconductor films. This is because these gases also have simple ionization potential spectra.

In addition to the excellent energy transport properties of inert gases as compared to hydrogen and other gases, argon also possesses etching properties. As a result, the probability for argon etching of unstable semiconductor atoms having two or three dangling bonds within the amorphous component during film growth increases and becomes higher than that for etching of atoms in the crystalline component. Consequently, semiconductor films deposited using argon as a dilution gas have fewer dangling bonds than semiconductor films deposited using gases such as hydrogen or helium for dilution and tend to have higher degrees of crystallization (the ratio of the crystalline component to the total).

Further, as a result of the same principle, the deposited film is composed of relatively stable groups of atoms because the unstable atoms are selectively removed by argon during film growth. This means that even if the argon-based semiconductor layers in this innovation are subjected to large energy inputs during a short time, effects such as atom scattering from the semiconductor layer do not occur easily. In other words, it is difficult to damage Ar-based semiconductor films during crystallization by means such as laser irradiation and rapid thermal annealing in comparison to hydrogen or other gas-based semiconductor layers; and Ar-based semiconductors are more suitable for crystallization.

Also, as explained in relation to the TDS measurements, the activation energy for desorption of hydrogen bonded to the At-based semiconductor layers of the present invention is higher than that of hydrogen bonded to normal semiconductor layers, and desorption begins at a higher temperature. This means that the liberation of hydrogen during crystallization proceeds relatively slowly in Ar-based semiconductor films even for a large energy input in a short time period (a semiconductor layer heating rate of from about $10°$ C./sec to $10^{11°}$ C./sec), and damage to the semiconductor layer does not occur during crystallization. In contrast, when light elements such as hydrogen or helium are used as dilution gases, there is a large number of unstable atoms within the deposited layer in which three of the four silicon bonds are unsatisfied and bonding to other silicon atoms is through the single remaining bond. For these films, even a slight amount of energy input breaks the bonds of the unstable atoms, and semiconductor atom scattering and the macroscopic results of film damage can occur easily. Also, because the hydrogen desorption energy is low, hydrogen will be explosively liberated even from semiconductor layers subjected to only a gradual heating rate (for example, on the order of 10° C./min). The resulting delamination or damage to the film will impede crystallization. The conclusion is that argon is the most suitable dilution gas for the present invention followed by inert gases such as helium.

A gas flow rate ratio with a source gas concentration (source gas/(source gas+additional gas)) of approximately 6.25% or less is a necessary condition. Except for the substrate surface temperature, there are also necessary conditions for the other two parameters; and the (Ar)—mixed-crystallinity films of the present invention can only be deposited when the necessary conditions of the three parameters are simultaneously satisfied. (Ar)—mixed-crystallinity films can still definitely be deposited even if the other two parameters have values near the necessary condition values (when it seems as though the necessary conditions will be violated) when the source gas concentration is less than or equal to approximately 3.23%. If the concentration is too low, because the deposition rate becomes slow, the effects of oxygen and water from the background vacuum and impurity gases such as carbon dioxide cannot be ignored; and the semiconductor film quality deteriorates. If the concentration is around 0.36% or higher, these impurity effects disappear; and good quality semiconductor films can be obtained.

The necessary condition for the pressure is approximately 1.0 Torr or higher. (Ar)—mixed-crystallinity films can still definitely be deposited even if the other two parameters have values near the necessary condition values (when it seems as though the necessary conditions will be violated) when the pressure is on the order of 1.6 Torr or higher. If the pressure is too high, the plasma is unstable; and it appears that anomalous discharges are generated. For the gas flow rate ratio used in the present invention, a pressure of around 2.7 Torr or less is desirable to establish a stable, uniform plasma.

The necessary condition for the electrode separation distance is around 17.8 mm or greater. (Ar)—mixed-crystallinity films can still definitely be deposited even if the other two parameters have values near the necessary condition values (when it seems as though the necessary conditions will be violated) when the electrode separation distance is around 25.4 mm or larger. If the electrode separation distance is too large, the plasma is again unstable; and it appears that anomalous discharges are generated. A stable, uniform plasma is generated in the present invention when the electrode separation distance is less than or equal to approximately 45.7 mm.

Although there is no necessary condition for the substrate surface temperature, mixed-crystallinity films can be relatively easily obtained at temperatures of 200° C. or higher. From the standpoint of being able to use low-priced, large glass substrates without problems, a temperature of 400° C. or less is desirable.

For deposition of (Ar)—mixed-crystallinity films, it is desirable to have a low source gas concentration, a high pressure, and a wide electrode separation. By keeping the source gas concentration low, or the pressure high, and the electrode separation distance wide, the film quality of as-deposited films have higher degrees of crystallinity, lower hydrogen contents, stronger peaks at 2102 cm$^{-1}$ and 2084 cm$^{-1}$, and crystallization by laser irradiation or rapid thermal annealing can be performed more easily as will be explained later. Concerning the hydrogen content, TDS measurements of films deposited, for example, using the PECVD reactor described in Section 2-3 with a monosilane flow rate to 100 sccm, an argon flow rate of 7000 sccm (a monosilane concentration of 1.41%), rf power of 600 W (power density of 0.228 W/cm$^2$), pressure of 2.25 Torr, electrode separation distance of 35.56 mm, a lower plate electrode temperature of 380° C., and a deposition rate of 0.1703 nm/sec gives about 1.83 atomic percent showing that it is possible to decrease the hydrogen content to near the level of amorphous semiconductor films deposited by LPCVD.

As explained previously, in this system, the energy to promote film growth reactions on the substrate surface is provided by ions and radicals from the dilution gas. The lifetime of these ions and radicals, however, decreases exponentially with pressure and electrode separation. This is because the probability of ion or radical collisions increases as the pressure increases or the separation distance increases. As a result, the deposition rate DR (nm/sec) can be expressed by the following equation.

$$DR = d_0 \exp\{-(aS+bP)\}$$

Here, $d_0$ is known as the preexponential factor (nm/sec) and is a coefficient determined bN, factors such as the gas flow rate, reactor geometry, rf power density, and substrate temperature. This coefficient has a strong positive correlation to the silane or other source gas flow rate. That is, as the source gas flow rate increases, do increases accordingly. S is the electrode separation distance (mm), and P is the pressure (Torr). Using the PECVD reactor described in Section 2-3, a monosilane flow rate of 100 sccm, an argon flow rate of 7000 sccm, rf power of 600 W, and a lower plate electrode temperature of 380° C., $d_0$, a, and b take the following values.

$d_0$=8.70(nm/sec)

$a$=0.0522(mm$^{-1}$)

$b$=0.9258(Torr$^{-1}$)

The (Ar)—mixed-crystallinity films of the present invention are fabricated while the deposition rate by PECVD satisfies the above exponential relation in terms of pressure and electrode separation distance.

Now, the above mentioned equation for the deposition rate means that the deposition rate decreases if the three important parameters for the (Ar)—mixed-crystallinity films move in the direction of the desired values for the source gas concentration, the pressure, and the electrode separation distance. For example, when a 30 minute deposition under the following conditions is attempted, a film thickness of only about 3 nm (deposition rate: DR=0.0017 nm/sec) is obtained:

Silane flow rate: SiH$_4$=25 SCCM

Argon flow rate: Ar=7000 SCCM (source concentration 0.36%)

Pressure: P=2.7 Torr

Electrode separation: S=45.7 mm

High frequency power: RF=600 W (0.228 W/cm$^2$)

Lower plate electrode temperature: Tsus=380° C.

Substrate surface temperature: Tsub=349° C.

Because, as will be explained later, the semiconductor film in thin film semiconductor devices are usually on the order of several tens of nm to several hundred nm, such a deposition rate is too slow and can be said to be impractical from a production point of view. Also, as described in section (2-2), a deposition rate of 0.15 nm/sec or higher is desirable for a system in which the ratio of the deposition pressure to the background pressure or the ratio of impurities in the gases is on the order of 10$^{-5}$ to 10$^{-6}$. The reason for this is that such a deposition rate seems to be able to avoid the negative effects of impurity gases such as oxygen, water, carbon monoxide and carbon dioxide when they are incorporated into semiconductor films for this level of background pressure or gas purity.

If a film is deposited with a deposition rate of less than about 0.15 nm/sec, a low quality film with low density and a large amount of gaps results; and the purity of the semiconductor film also decreases. Therefore, it is desirable to deposit high purity, high quality (Ar)—mixed-crystallinity films while simultaneously satisfying the various conditions mentioned previously as well as a deposition rate greater than about 0.15 nm/sec. Why 0.15 nm/sec is a threshold value is not certain, but if the pressure ratio or the ratio of impurities mentioned previously is decreased from 10$^{-6}$ to a high-vacuum, high-purity ratio on the order of 10$^{-7}$; it is possible to decrease the minimum deposition rate to 0.015 nm/sec or greater.

As mentioned above, if the viewpoint of production practicality is included, a desirable minimum deposition rate is around 0.3 nm/sec. It is possible to simultaneously meet the restrictions of the various conditions described earlier as well as the deposition rate by increasing the pumping speed of the reaction chamber. In general, the following relationship between the gas flow rate Q, the reaction chamber pressure P, and the reaction chamber pumping speed Sp is known:

$$P = Q/Sp \qquad (1).$$

In the example given above, since the total gas flow rate Q=7025 SCCM, the pressure P=2.7 Torr, the reaction chamber pumping speed is Sp=Q/P=2.60 SCCM/mTorr (1 SCCM/mTorr=12.67 1/sec). By increasing this pumping speed and keeping the pressure fixed, it is possible to increase the gas flow rate Q.

Since the deposition rate has a strong positive correlation with the source gas flow rate, it is possible to regulate the deposition rate using the gas flow rate Q. For example, if the pumping speed is made ten times that of the previous example or 26.0 SCCM/mTorr, it is possible to also increase the gas flow rate by ten times to a silane flow rate of 250 SCCM and an argon flow rate of 70000 SCCM. The result is that the source concentration, pressure and other deposition conditions are kept the same as in the example, but it is possible to increase the deposition rate by roughly ten times (0.017 nm/sec). Increasing the reaction chamber pumping speed Sp results in a higher vacuum condition for the background pressure, and decreases the incorporation of impurity gases into the semiconductor film. Although in this example Sp=2.60 SCCM/mTorr, it is desirable to have a reaction chamber pumping speed of 10 SCCM/mTorr or higher in order to obtain a deposition rate (0.3 nm/sec or greater) which will realize a high purity, highly crystalline, highly dense (Ar)—mixed-crystallinity film.

(2-5, TFT Thin Film Semiconductor Device Channel Layer Thickness and Transistor Properties)

Here, the relationship between the thickness of the active layer semiconductor film which forms the channel in a TFT thin film semiconductor device (this is abbreviated as "channel layer thickness" in this application) and the transistor properties will be discussed. Generally, the optimum film thickness for the semiconductor film to be used as the channel in a thin film semiconductor device depends strongly on the fabrication method. This is because the film quality of the semiconductor film varies widely with the film thickness. For example, in systems 'such as SOS (silicon on sapphire) and SOI (silicon on insulator) in which the film quality does not, as a rule, depend on the film thickness, the transistor properties improve for thinner semiconductor films. (Here, this principle is called the "thin film effect.") This is because the inversion layer quickly spreads throughout the entire film thickness and the inversion layer can form readily in the case of thin semiconductor films (the threshold voltage Vth decreases).

On the other hand, in thin film semiconductor devices using non-single crystalline films such as polycrystalline silicon films for the channel layer, it is normal for the quality of the semiconductor film to be vastly different depending on the film thickness; and, as a result, the mechanism mentioned above is much more complicated. Usually, the film quality of polycrystalline films worsens as the film thickness decreases. Specifically, in comparison to thick films, the grain size in thin films is smaller; and the number of internal grain detects and grain boundary traps is simultaneously large. If the grain size is small, the mobility of thin film semiconductor devices using such films will be low. Additionally, if the number of internal grain defects and grain boundary traps is large, the spread of the depletion layer slows; and the threshold voltage Vth increases substantially. (Here, this principle is called "thin film degradation.")

Ultimately, the thin film effect mentioned earlier and thin film degradation are competing processes. If the films are made thin but there is little change in film quality (thin film degradation is small), the thin film effect is applicable; and the transistor properties improve with thinner films. Conversely, if the films are made thin and there is a remarkable degradation of the film quality (thin film degradation is large), the thin film effect is canceled; and transistor properties worsen for thinner films. In other words, depending on the magnitude of the film quality dependence on the film thickness, the transistor properties may improve or may worsen with the use of thinner films. This dependence of film quality on film thickness differs depending on fabrication technique; and also differs depending on film thickness. Consequently, the optimum semiconductor film thickness is completely different depending on the fabrication process of the thin film semiconductor device; and the optimum thickness value must be determined for each fabrication process.

(2-6, Optimum Film Thickness of As-deposited Mixed-crystallinity Semiconductor Films)

Here, the optimum film thickness of (Ar)—mixed-crystallinity semiconductor films described in section (2-4) when used in the as-deposited condition as the active layer semiconductor film of a thin film semiconductor device is discussed. For a film thickness from zero to 40 nm, the film quality is extremely poor in comparison to a normal crystallized film. The film, similar to small crystal grains existing as islands in an amorphous sea, has extremely low crystallinity and an extremely large number of defects. Consequently, the minimum film thickness is around 40 nm. As the film thickness becomes around 60 nm or greater, crystalline components begin to appear in the amorphous region; and the ratio with respect to the amorphous region increases as the film thickness increases. In other words, the crystallinity of the film improves as the film becomes thicker. For a thickness greater than about 300 nm, films grow with roughly the same crystalline condition. The film thickness dependence of the transistor properties also varies in response to these variations in film quality as a function of film thickness.

Because the film quality essentially does not vary for thicknesses of 300 nm or more (since there is essentially no thin film degradation), the thin film effect operates predominantly and transistor properties improve for thinner films. For film thicknesses between about 300 nm and 200 nm, thin film degradation begins to operate; but, like before, the thin film effect is dominant, and although looser than for thicknesses greater than 300 nm, transistor properties improve as film thickness decreases. For film thicknesses between about 200 nm and 60 nm, thin film degradation and the thin film effect compete; and the maximum "on" state transistor properties are obtained. For films less than about 60 nm, thin film degradation overcomes the thin film effect and transistor properties worsen as film thickness decreases. In other words, for the case of the present invention, transistor properties are best for semiconductor film thicknesses between about 60 nm and 200 nm; and ideally between about 80 nm and 150 nm.

Up to this point, transistor properties based on the "on" state have been discussed; but leakage currents in the "off" state also differ depending on film thickness. The theory of off leakage in thin film semiconductor devices is not well understood. In the present invention, the theory is unclear; but there is a strong positive correlation between film thickness and off leakage for films around 130 nm or thicker. As the films become thicker, the off leakage becomes larger. For films less than about 130 nm, the correlation weakens; and the off leakage becomes independent of the film thickness. That is, the minimum value in the off leakage current is essentially invariant for film thicknesses between zero and about 130 nm. Consequently, the film thickness yielding the best "on" state transistor properties and a minimum off leakage is between about 50 nm and 130 nm with an ideal thickness between about 80 nm and 130 nm.

When the thin film semiconductor device of the present invention is used in an LCD, it is recognized that the effects of optical leakage current must be considered. The off leakage current of thin film semiconductor devices usually increases as a result of light illumination. This is called optical leakage current, and a sufficiently small optical leakage current is a condition for a good quality thin film semiconductor device. The optical leakage current is roughly proportional to film thickness for the thin film semiconductor devices of the present invention. To be compatible with both reliable fabrication and optical leakage current, a film thickness between approximately 20 nm and 100 nm is desirable.

Simultaneously considering off leakage, optical leakage, and on current, a system which satisfies all three would have a film thickness from approximately 60 nm to 130 nm and ideally from approximately 80 nm to 100 nm. Further, the low temperature activation at 350° C. or less of implanted ions in the source and drain regions as in the present invention is fairly difficult. Therefore, in order to reliably perform activation, the semiconductor film thickness must be set to a minimum. In the present invention, that value is around 70 nm. Additionally, when using an LDD structure, 90 nm or thicker is desirable because the activation of the LDD region is difficult.

(2-7, Crystallization and Melt Crystallization of Semiconductor Films in the Present Invention)

It has been discovered that if the semiconductor films of the present invention described in section (2-4) are crystallized by laser irradiation or other means, crystallization by melt crystallization or SPC is possible even if there is no annealing prior to the crystallization step. This will be explained using FIG. 8. FIG. 8 shows the change in crystallinity as a function of laser irradiation for the (Ar)—mixed-crystallinity as-deposited films described in detail in Section (2-4). That is, a 50 nm (Ar)—mixed crystallinity film was deposited using the following conditions, directly irradiated with a 308 nm wavelength XeCl excimer laser without any type of prior annealing (an as-deposited film), and the changes in crystallinity examined:

Silane flow rate: $SiH_4$=50 SCCM

Argon flow rate: Ar=3000 SCCM (source concentration 1.34%)

High frequency power: RF 600 W (0.228 W/cm$^2$)

Pressure: P=1.5 Torr

Electrode separation: S=24.4 mm

Lower plate electrode temperature: Tsus=380° C.

Substrate surface temperature: Tsub=349° C.

The excimer laser light source had a full-width at half-maximum of approximately 45 nsec, and a single irradiation was carried out at each energy using a square beam cross-section to approximately 1 cm×1 cm. The horizontal axis of FIG. 8 shows the energy density at the substrate surface for each irradiation, and the vertical axis shows the semiconductor filing degree of crystallinity after each irradiation. The degree of crystallinity was measured by multiple wavelength spectroscopic ellipsometry. The black data points indicate conditions in which damage was done to the semiconductor film and correspond to the D condition in FIG. 1.

Since a degree of crystallinity of about 70% or higher determined by spectroscopic ellipsometry can be called a polycrystalline condition, it can be seen that crystallization proceeds thoroughly for laser energy densities between approximately 100 mJ×cm$^{-2}$ and 150 mJ×cm$^{-2}$. In FIG. 8, the degree of crystallinity attains a maximum value of 92% when the energy density is 145 mJ×cm$^{-2}$; and it is possible to obtain a high quality crystalline semiconductor film. As shown by this example, it is possible to easily produce a high quality polycrystalline semiconductor film having a high degree of crystallinity using the (Ar)—mixed-crystallinity semiconductor films of the present invention by simple laser irradiation without any previously employed dc hydrogenation annealing.

After producing a poly-Si film using this procedure, it is possible to fabricate a poly-Si TFT using a low temperature process according to the fabrication procedure described in (1. Outline of the Fabrication Procedure of a Thin Film Semiconductor Device of the Present Invention). It is possible to routinely produce high performance thin film semiconductor devices reflecting the high crystallinity of melt-crystallized films and having mobilities around 100 cm$^2$×V$^{-1}$×sec$^{-1}$.

Although methods such as Raman spectroscopy revealed the slight presence of crystal structure in the semiconductor films of the present invention described in Section (2-4), it would be difficult to call the films polycrystalline. Also, the density is as low as the amorphous silicon films deposited by PECVD of the prior art; and when there is a large amount of hydrogen, the films contain slightly less than 20% of silicon atoms.

The details of why such films are able to thoroughly melt crystallize are not known. It may be that the amorphous region is more easily melted than the microcrystalline region, and that the microcrystals that float in the melted silicon liquid play a glue-like role which restricts the evaporation and scattering of the melted silicon liquid. Additionally, it may be that the microcrystals act as crystal growth nuclei during the solidification cooling step. As a result, the laser energy density needed to affect melt crystallization of the (Ar)—mixed-crystallinity semiconductor films is around 50 mJ×cm$^{-2}$ less than before. This means that when melt crystallizing semiconductor films using the same laser irradiation equipment at the same laser power, a wider area can be crystallized by a single laser irradiation in the case of the (Ar)—mixed-crystallinity films of the present invention than in the case of amorphous films of the prior art. In other words, the burden on the laser irradiation equipment is lighter for (Ar)—mixed-crystallinity films; and productivity is increased.

As was explained in detail in section (2-4), it is possible to obtain highly crystalline mixed-crystallinity films in the as-deposited condition even by conventional PECVD under special film deposition conditions. The film quality, however, is not as good as that of crystallized films. On the other hand, crystallization of films obtained from normal PECVD is difficult without a dehydrogenation or precise annealing. In contrast, crystallization by RTA or VST-SPC, or melt crystallization by means such as laser irradiation, of highly crystalline mixed-crystallinity semiconductor films can be carried out extremely simply. This seems to be because in the as-deposited condition, since much of the film is already crystallized and the remaining amorphous component is low, crystallization of the remaining amorphous component can proceed with a relatively low supply of energy.

Even when melt crystallization proceeds with a high energy, because the polycrystalline component plays the role of a glue which prevents the evaporation and dispersion of the semiconductor atoms, crystallization can proceed without damaging, roughening or vaporizing the surface of the semiconductor film. Ultimately, it can probably be said that rather than using the mixed-crystallinity as-deposited semiconductor films of the present invention as the active region of thin film semiconductor devices, such films are more appropriate as the initial semiconductor layer when fabricating low temperature poly-Si TFTs using melt crystallization and keeping the maximum processing temperature less than or equal to 350° C. In other words, a highly crystalline mixed-crystallinity semiconductor film is formed by PECVD or other method of top of an insulating material. After the film is then crystallized using either solid phase crystallization via RTA or VST-SPC, or melt crystallization via laser irradiation or of the technique, a high performance thin film semiconductor device can be easily fabricated while keeping subsequent processing steps at 350° C. or less.

In the present invention, (Ar)—mixed-crystallinity semiconductor films can be obtained by PECVD if the flow rate ratio of the inert gas, such as argon, to monosilane or other chemical specie which contains constitutive elements of the semiconductor film is around 15:1 or less (monosilane concentration of around 6.25% or less). In general, mixed-crystallinity silicon films can be deposited by PECVD if the monosilane is diluted by about 3% with hydrogen. According to the experiments of the inventor, however, melt crystallization of hydrogen-monosilane mixed crystallinity films without annealing is fairly difficult. Although in some cases, crystallization is possible without annealing, in audition to having extremely low repeatability, the range of laser energies which allow successful melt crystallization is considerably limited, being at most 10 mJ/cm$^2$ or less. Even with crystallization, microcrystalline silicon grains are generated, the deviation in transistor properties is large, and the increases in defect density make the films unsuitable for practical use.

In contrast, by controlling the semiconductor film thickness and deposition conditions, it is possible to thoroughly crystallize argon-monosilane mixed crystallinity silicon films over a wide energy range from approximately 50 mJ/cm$^2$ to approximately 350 mJ/cm$^2$. (Of course, microcrystalline grains do not exist following crystallization of (Ar)—mixed-crystallinity films.) The reasons can be summarized from the preceding discussion as given below.

(1) Because the films have mixed crystallinity, crystallization proceeds even for a small energy input.

(2) The crystalline component plays a glue-like role which restricts the evaporation and scattering of the melted silicon.

(3) The content of unstable atoms which cause scattering and microcrystalline grain generation in as-deposited films is decreased by Ar etching.

(4) The hydrogen content of mixed-crystallinity films is decreased.

(5) Only strongly bound hydrogen remains in (Ar)—mixed-crystallinity films.

As a result, the hydrogen in the films is released gradually only at relatively high temperatures. Therefore, even when a fixed energy is supplied to the films, there is no explosive release of hydrogen as found in hydrogen-based silicon films.

While hydrogen-based mixed-crystallinity semiconductor films are also suitable for semiconductor films of the low temperature process crystalline thin film semiconductor devices, it can be said that the (Ar)—mixed-crystallinity semiconductor films described in detail in Section (2-4) are even more suitable.

Next, the annealing process for crystallizing the semiconductor films of the present invention will be explained. The exceptionally useful annealing process in the present invention is performed by a technique such as melt crystallization or VST-SPC of the semiconductor layer with laser or high energy optical irradiation. Here, first the irradiation procedure will be explained using a xenon chloride (XECl) excimer laser (wavelength of 308 nm) as an example. The laser pulse width at full-width, half maximum intensity (that is, the annealing process time) is short, from approximately 10 nsec to 500 nsec. In this example, the laser pulse full-width at half-maximum is 45 nsec. Because the irradiation time is so exceptionally short, the substrate does not get heated during crystallization of mixed-crystallinity or other semiconductor films and the substrate is not distorted.

Laser irradiation is performed with the substrate between about room temperature (25° C.) and about 400° C. in air, in vacuum with a background pressure of from approximately 10$^{-4}$ Torr to approximately 10$^{-9}$ Torr, in a reducing environment containing hydrogen or minute amounts of monosilane, or in an inert environment such as helium or argon. A square area of between 5 mm square and 20 mm square (8 mm square, for example) is irradiated during each laser irradiation, and the irradiated region is shifted by between about 1% and 99% after each irradiation (for example 50%: 4 mm in the previous example). At first, after scanning is performed in the horizontal direction (Y direction), the substrate is then shifted a suitable amount in the vertical direction (X direction). It is then moved a fixed distance in the horizontal direction, where it is again scanned. Thereafter these scans are repeated until the entire surface of the substrate has been subjected to the first laser irradiation. For this first laser irradiation, an energy density of between 50 mJ/cm$^2$ and 300 mJ/cm$^2$ is desirable.

After the first laser irradiation is completed, a second laser irradiation is performed over the entire surface as necessary. When performing the second laser irradiation, an energy density higher than that of the first irradiation is desirable. A value between about 100 mJ/cm$^2$ and 1000 mJ/cm$^2$ is good. The scanning method used for the second irradiation is identical to that used for the first laser irradiation; scanning is performed while shifting the square irradiation area in appropriate increments in the Y and X directions. Additionally, it is possible to further increase the energy density and perform third and fourth laser irradiations as necessary.

By using such a process in which, following multiple irradiations at high energy, the energy density is reduced in stages of multiple irradiation, symmetrical coincidence grain boundaries are produced; and the transistor threshold voltage decreases and the mobility increases to approach the quality of crystalline semiconductor films. Additionally, it is possible to completely eliminate variations caused by the laser beam edges by using such a multi-stage laser irradiation method. Not only for each irradiation in the multi-stage laser irradiation but even in a normal single stage irradiation, all laser irradiations are performed at energy densities which do not damage the semiconductor film.

In addition to the method described above, effecting crystallization by scanning line-shaped laser light having a width of approximately 100 mm or more and a length of several tens of centimeters is also permissible. In this case, the overtap in the direction of the width of the beam for each irradiation is set to be from about 5% to about 95% of the beam width. If the beam width is 100 mm and the amount of overlap for each beam is 90%, because the beam advances 10 mm for every individual irradiation, the same spot receives 10 laser irradiations. Since at least five or more laser irradiations are usually desirable in order to uniformly crystallize a semiconductor film over the entire substrate, a beam overlap for which irradiation of around 80% or higher is required. In order to definitely produce highly crystalline polycrystalline films, it is desirable to control the amount of overlap to be from around 90% to 97% so that the same spot is irradiated from around 10 to 30 times.

Although up to this point an XeCl excimer laser has been described as an example of a laser light source, other lasers, including continuous oscillation lasers, may be used provided the laser irradiation time for the same spot of the semiconductor film is within about 10 msec or less and only a portion of the substrate is irradiated. For example, irradiation may also be performed using an ArF excimer laser, XeF excimer laser, KrF excimer laser, YAG laser, carbon dioxide gas laser, Ar laser, dye laser or other type of laser.

Next, the high energy optical irradiation crystallization method will be explained with reference to FIG. 13. Although high energy light does not have uniform phase as in a laser, the optical energy density is increased through focusing by a lens. The deposited semiconductor layer is exposed either continuously or non-continuously to repetitive high energy light which is scanned to effect melt crystallization or VST-SPC crystallization of the semiconductor layer. High energy optical irradiation unit 50 is composed of light source 51 such as an arc lamp or tungsten lamp, reflector 52 surrounding the light source, and optical system 53 containing a focusing lens or optical shaping lens and an optical scanning system. The light produced by light source 51 is primarily shaped by reflector 52, and the energy density is increased to produce singly focused light 55. This singly focused light is further modified to increased energy density by means of optical system 53, and simultaneously becomes scanning focused light 56 by means of the scanning function. The light irradiates semiconductor layer 61 which has been formed over substrate 60.

The processing t me for a single point on the semiconductor layer is determined by the length of the irradiation region in the scanning direction and the scanning speed. For example, suppose the irradiation region is rectangular with a length (length in the Y direction) of 50 mm and a width (length in the X direction) of 5 mm, and the scanning speed in the X direction is 500 mm/sec, the processing time is 10 msec. The temperature of the irradiation region is determined by the power input to the light source, the condition of the shaped light, and the processing time. Depending on the semiconductor layer material and the film thickness, these values are suitably controlled and high energy optical irradiation is performed. Although it is desirable to have the processing area be approximately 100 $mm^2$ or higher in order to increase the throughput, in order to keep the thermal effects to the substrate to a minimum, an area of approximately 500 $mm^2$ or less is required. Further, a processing time of less than approximately 10 msec is desirable principally from the point of thermal effects. The results are that only the region on semiconductor layer 61 irradiated by scanned, focus light 56 is locally crystallized. The first annealing step is completed if this process is repeated, and the desired region of the semiconductor layer is scanned.

Next, the crystallization method using the rapid thermal annealing (RTA) unit will be described. FIG. 14(a) is a schematic cross-sectional diagram of the RTA unit used in this invention. Looking from the up-stream side to the down-stream side of the direction of substrate transport (the direction of arrow X), this machine is composed of 35 cm long first preheat zone 2, 35 cm long second preheat zone 3, 25 cm long third preheat zone 4, annealing zone 5, and cleaning zone 6. In the first to third preheat zones 2 to 4 and in cleaning zone 6, heaters are located below the substrate transport plane; and the substrate is heated to the desired temperatures. In annealing zone 5, arc lamps 5A and 5B and reflectors 5C and 5D for converging the arc lamp light are arranged above and below in order to irradiate transported substrate 11 with energetic light. The converged arc lamp light takes the shape of a long, narrow band (refer to FIG. 14(b)). The energetic light irradiation area on substrate 11 has a width of about 10 mm with respect to the direction of substrate travel. Because substrate 11 is transported at a fixed speed, the RTA processing time is determined in accordance with that transport speed. For example, when substrate 11 travels at 15 mm/sec, the RTA processing time is 0.6667 seconds. In this invention disclosure, the expressions "RTA processing time" and "annealing process time" are used to mean the time interval during which the RTA light (energetic light) is irradiating the substrate.

The RTA annealing temperature is determined by the set point temperatures of the first to third preheat zones, the output of arc lamps 5A and 5B, and the substrate transport speed (that is, the RTA processing time). In this invention disclosure, "RTA processing temperature" and "crystallization annealing step temperature" are used to mean the temperature along edge 5F in energetic light irradiation region 5E. In the RTA unit used in the present invention, this temperature is measured by an infrared pyrometer; and the annealing step is controlled. This temperature also corresponds to the highest temperature during the RTA process. The temperature profile of a given point on an actual substrate 11 shows the changes as seen in FIG. 14(c).

After the substrate being processed passes through first through third preheat zones 2 to 4, when it enters annealing zone 5 the substrate temperature rises rapidly, and the peak temperature P is attained near the exit of annealing zone 5. This maximum temperature is the RTA processing temperature in this invention disclosure. Following this, the substrate enters cleaning zone 6; and the substrate temperature gradually decreases.

Now, using such an RTA unit, the processing area of the crystallization annealing step is sufficiently small compared to the substrate area. For example, assuming a 300 mm×300 mm square substrate, because the energetic light irradiation region is 10 mm×300 mm (=3000 $mm^2$), the ratio of the annealing area to the substrate area is 3.3%. For a 550 mm×650 mm substrate, the annealing region is 10 mm×550 mm (=5500 $mm^2$); and the annealing area to substrate area ratio is 1.5%. In crystallization by RTA, because the energy irradiation time is short, and the annealing is localized with respect to the entire substrate; there is no thermal distortion or cracking of the substrate. When crystallizing a semiconductor film, the heater in first preheat zone 2 in the RTA unit (FIG. 14, a) is set to an appropriate temperature between 250° C. and 550° C., the heater in the second preheat zone 3 is set to an appropriate temperature between 350° C. and 650° C., and the heater in the third preheat zone 4 is set to a suitable temperature between 450° C. and 750° C. The transport speed of substrate 11 is varied from 2 mm/sec to 50 mm/sec which results in the RTA processing time varying in the range of 0.2 seconds to 5 seconds. Additionally, the output power values of the upper arc lamp 5A and the lower arc lamp 5B are independently controlled from 3 W to 21 W. The result is that the RTA processing temperature (substrate temperature measured in annealing zone 5 (the temperature at edge 5F in lamp irradiation region 5E) by an infrared pyrometer) can be freely set between 400° C. to 900° C. Thus, annealing the semiconductor film under the appropriate conditions completes the crystallization of the semiconductor film.

It is also acceptable to use lamp sources such as tungsten lamps in place of arc lamps as the light source. The (Ar)—mixed-crystallinity films of the present invention already have a significant crystalline component in the as-deposited condition; and show no damage, declamination, or scattering even when subjected to large energy inputs in a short time period. Consequently, crystallization can occur easily and stably even using RTA; and, since the supplied energy (proportional to the product of RTA processing temperature and processing time) is relatively small, distortion, warpage, and cracking of the substrate can be avoided.

In a-Si films of the prior art prepared by PECVD, even for furnace-SPC, in order to avoid rapid evolution of hydrogen, it was necessary to anneal at 450° C. prior to crystallization after increasing the temperature at a rate of 10° C./min or less. For the semiconductor films of the present invention, however, not only for melt crystallization, but for all types of crystallization including furnace-SPC, RTA, and VST-SPC, annealing prior to crystallization is not necessary.

(2-8, Optimum Film Thickness of (Ar)—Mixed-Crystallinity—Crystallized Films)

Here, the optimum poly-Si TFT semiconductor film thickness for a semiconductor film deposited as an (Ar)—mixed-crystallinity film and then crystallized for use in a low temperature process thin film semiconductor device of the present invention as described above is explained. During fabrication of a mixed-crystallinity film by PECVD or other methods, the deposited film coalesces to form a continuous film when the film thickness reaches approximately 10 nm or more. However, the density of the semiconductor film obtained using the PECVD process is from approximately 85% to 95% of the bulk film density. For this reason, if the 10 nm semiconductor film of the PECVD process is crystallized, its film thickness will fall to 9 nm after crystallization. Thus, the minimum filing thickness of a (Ar)—mixed-crystallinity—crystallized film is 9 nm.

If the film thickness after crystallization is around 18 nm or more, the transistor properties of the melt crystallized film will begin to improve. That is, in (Ar)—mixed-crystallinity—melt crystallized films, at 18 nm or less, thin film degradation is dominant; and, at 18 nm or higher, thin film degradation decreases, and the thin film effect becomes competitive. This will continue if the film thickness is between 18 nm and 90 nm, and the transistor properties are optimum for films within this thickness range. If the film is thicker than 90 nm, the thin film effect takes control and the transistor properties will gradually deteriorate as the thickness of the film increases. If the semiconductor film thickness is 30 nm or more, it is possible to have stable production of highly integrated thin film semiconductor devices that require fine geometry fabrication. In other words, with RIE, contacts holes can be opened reliably without the appearance of contact failure. If the semiconductor film thickness immediately after deposition is 50 nm or more (around 45 nm or more after crystallization), the crystalline component of the as-deposited film increases; and the laser energy range over which melt crystallization is possible without prior annealing increases.

If the thickness of the semiconductor film deposited by PECVD or other methods is less than about 120 nm immediately after deposition (less than about 108 nm after crystallization), the entire semiconductor layer can be uniformly heated and crystallization can proceed smoothly during melt crystallization using a laser or other means. If the semiconductor film immediately after deposition is 200 nm or thicker, only the upper portion of the layer is melted during laser irradiation from above and the bottom portion of the layer retains amorphous regions. This adds to the thin film effect and the transistor properties severely deteriorate. Therefore, the maximum film thickness for melt crystallized films is on the order of 180 nm.

When the thin film semiconductor device of this invention is used in an LCD, it is desirable to consider the effects of off state leakage current and optical leakage current. If the film thickness after crystallization is around 150 nm or less, the leakage current when the transistor is in the off state is sufficiently small. In the case of the thin film semiconductor device of this invention as well, the optical leakage current is proportional to the film thickness. From the perspective of the coexistence of reliable production and optical leakage current, it is desirable to have a film thickness from about 10 nm to 100 nm. When the film becomes 100 nm or thicker, it is no longer possible to ignore the optical leakage current; and the device is not desirable for use in an LCD.

In the case in which the off state leakage and optical leakage are important and when it is necessary to give even stronger consideration to on current, such as when using a thin film semiconductor device for the pixel switching element of an LCD, a system that would satisfy all conditions would have a thickness from about 30 nm to 150 nm, but ideally from about 45 nm to 100 nm. In order to reliably produce LDD structures with an activation temperature of 350° C., a film thickness of approximately 60 nm or more is desirable.

As described above, in accordance with the present invention, the following effects may be obtained.

Effect 1-1). Because the processing temperature is a low 350° C., it is possible to use low-priced glass and advances can be made in decreasing product prices. Further, it is possible to easily increase the size of high performance active matrix substrates and easily increase the size of high quality liquid crystal displays (LCDs).

Effect 1-2). It is possible to use conventional PECVD reactors and easily move from the current 360 mm×460 mm glass substrates to larger 550 mm×650 mm substrates.

Effect 1-3). The annealing step prior to crystallization of semiconductor films has become unnecessary, and it is possible to obtain high quality, crystalline semiconductor films by a simple process. It is possible to produce high performance thin film semiconductor devices using only presently available equipment.

Effect 1-4). The range of appropriate irradiation conditions which will allow uniform laser irradiation over the entire substrate is wide. Consequently, it is possible to reliably crystallize over the entire substrate surface even if there are slight variations in the laser irradiation energy.

Effect 1-5). In the melt crystallization process, because the crystallization process controls the crystalline component in the mixed-crystallinity semiconductor films, the variation in crystallinity from substrate to substrate and lot to lot is remarkably small. As a result, it is possible to both easily and reliably produce high performance thin film semiconductor devices.

Effect 1-6). It is possible to crystallize as-deposited semiconductor films by a single laser irradiation. As a result, productivity improves dramatically. Additionally, when irradiating the same spot several times or less, it is not particularly necessary to control the atmosphere around the periphery of the substrate. It is also possible to carry out laser irradiation in an air atmosphere. This means that productivity is further improved.

Effect 1-7). Since it is possible to set the laser energy density relatively freely, the optimum value can be selected with the result being an increase in grain size following laser irradiation. Therefore, the characteristics of thin film semiconductor devices using films with large grains become excellent.

Effect 1-8). It is possible to decrease the laser energy density for melt crystallization of semiconductor films by approximately 50 mJ×cm$^{-2}$. Therefore, for a single laser irradiation, it is possible to crystallize a wider area as compared to the prior art for amorphous films. This reduces the burden on the laser irradiation equipment, and simultaneously increases productivity.

As a result, by the present invention, it has become possible to reliably produce extremely good thin film semiconductor devices by realistic and simple means using fabrication equipment and processing temperature which allows the use of normal, large glass substrates.

In addition, in accordance with the present invention, the additional effect described below can be obtained.

Effect 2-1). It is possible to easily fabricate good thin film semiconductor devices having mobilities of 1 cm$^2 \times$V$^{-1} \times$sec$^{-1}$ or higher using a fabrication process identical to that of a-Si TFTs of the prior art without a special crystallization process.

In addition, in accordance with the present invention, the further additional effect described below can be obtained.

Effect 3-1). In the deposition of thin films by a single substrate PECVD reactor, thin films can be deposited with high productivity without the preparation of a special preheating chamber. Therefore, it is possible to suppress the enlargement of PECVD reactors and the associated steep increase in price. Further, when there is a preheating chamber, it is possible to minimize the preheating time after the substrates have been set in the reaction chamber even when the temperature of the robot in the transfer chamber is room temperature. This allows further increases in productivity. Thus, even in the deposition of thin films by a single substrate PECVD reactor, convenient and high productivity thin film deposition has become possible.

BRIEF EXPLANATION OF THE FIGURES

FIG. 14 is the RTA unit used in the present invention.

DETAILED DESCRIPTION OF THE INVENTION

Figure 1:
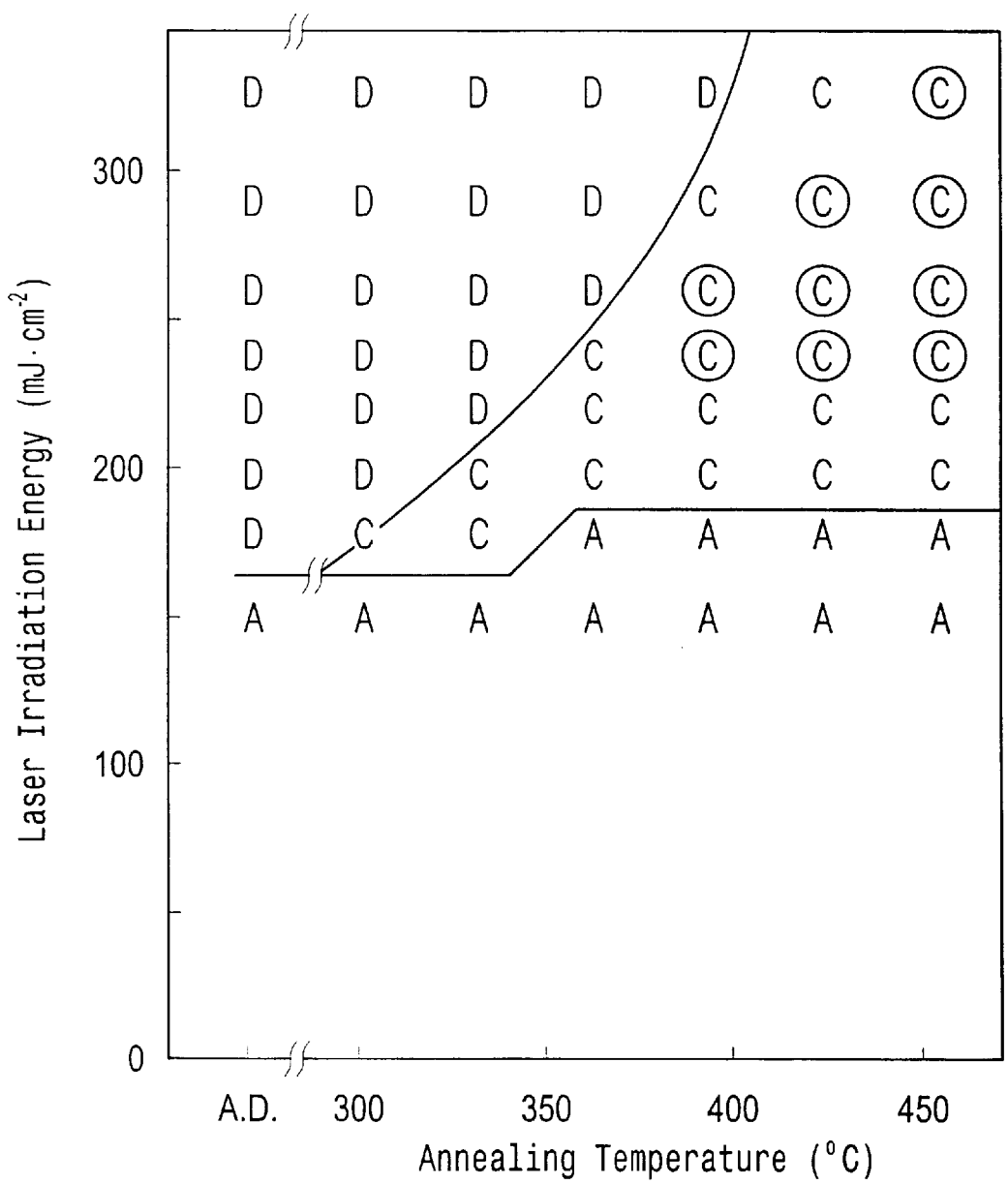
FIG. 1 shows the laser crystallization characteristics of a PECVD a-Si film of the prior art.
Figure 2A:
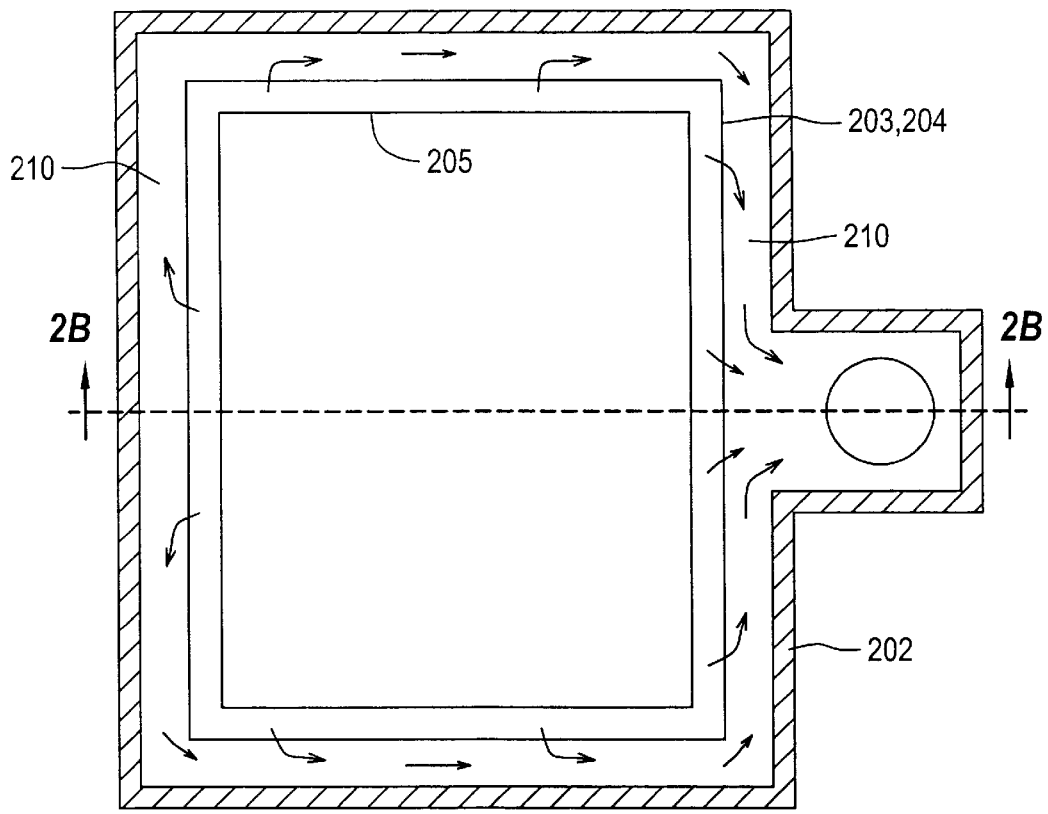
FIG. 2 shows the PECVD reactor used for the present invention.
Figure 2B:
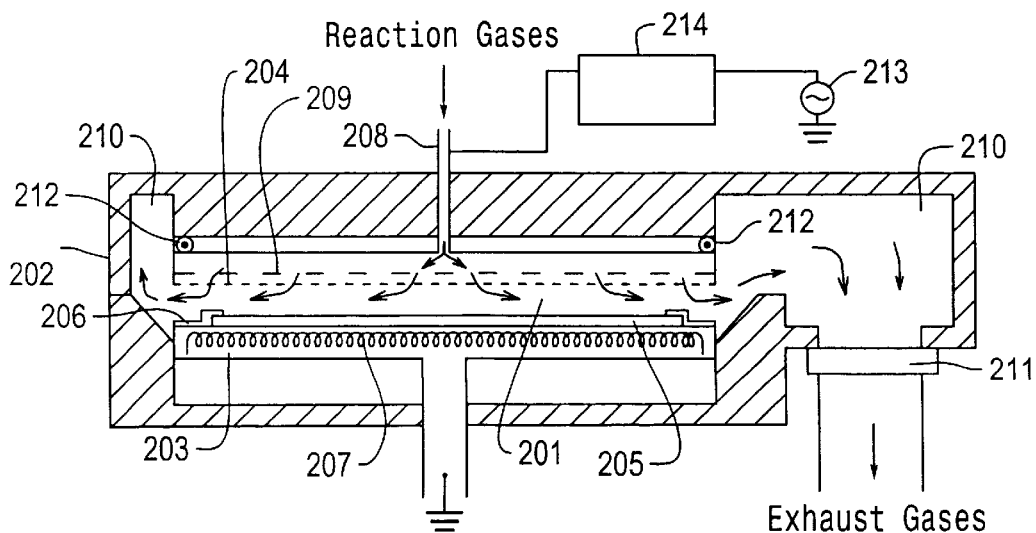

This invention is explained in further detail with reference to the accompanying figures.

EXAMPLE 1

An example of a semiconductor film according to the present invention and its fabrication by PECVD will be explained. After forming an underlevel protection layer, consisting of an insulating material such as a silicon oxide film, on at least part of the surface of a substrate, a semiconductor film is formed over this underlevel protection layer using the PECVD reactor described in detail in section (2-3).

A 360 mm×475 mm×1.1 mm glass substrate (OA-2) which is at room temperature is set in the PECVD reactor, the lower plate electrode 203 of which is maintained at a temperature of 380° C. The recipe followed once the substrate is in place in the PECVD reaction furnace is as follows.

(Preheat 1)

Time: t=90 s

Hydrogen flow rate: H$_2$=100 SCCM

Helium flow rate: He=3000 SCCM

High frequency power: RF=0 W (no plasma)

Pressure: P-3.0 Torr

Electrode separation: S=37.1 mm

Lower plate electrode temperature: Tsus=380° C.

(Preheat 2)

Time: t=60 s

Silane flow rate: SiH$_4$=100 SCCM

Argon flow rate: Ar=3000 SCCM

High frequency power: RF=0 W (no plasma)

Pressure: P=1.5 Torr

Electrode separation: S=37.1 mm

Lower plate electrode temperature: Tsus=380° C.

(Deposition)

Time: t=164 s

Silane flow rate: SiH$_4$=00 SCCM

Argon flow rate: Ar=3000 SCCM (source concentration 3.23%)

High frequency power: RF=600 W (0.228 W/cm$^2$)

Pressure: P=1.5 Torr

Electrode separation: S=37.1 mm

Lower plate electrode temperature: Tsus=380° C.

Substrate surface temperature: Tsub=349° C.

In Preheat 1, hydrogen and helium are introduced into the reaction chamber; and since the pressure is set somewhat high at 3.0 Torr, the total heating time can be shortened to 2 minutes and 30 seconds even if room-temperature glass substrates are loaded directly into the reaction chamber. Using the electrode separation distance of 3.71 cm, the reaction chamber volume V of 9765 cm$^3$, a gas flow rate Q=3100 sccm, pressure P=1.5 Torr, calculation of the time to completely replace the atmosphere during the second preheating gives $$t = (P/760) \times (V/Q) \times 13.82 = 0.086 \text{ minutes} = 5.2 \text{ seconds}.$$

Because the time of the second preheating is made sufficiently long at 60 seconds, the atmosphere during the second preheating is completely replaced, and there is no possibility for the first preheating to influence the film growth. The deposition rate of the semiconductor film under such conditions was 0.365 nm/sec, and the thickness of the semiconductor film was 60 nm. The hydrogen concentration in the silicon film measured by thermal desorption spectroscopy (TDS) was 10.39 atomic %. According to transmission electron microscopy observation, the amorphous component of this silicon film has a chiefly columnar structure.

Figure 9:
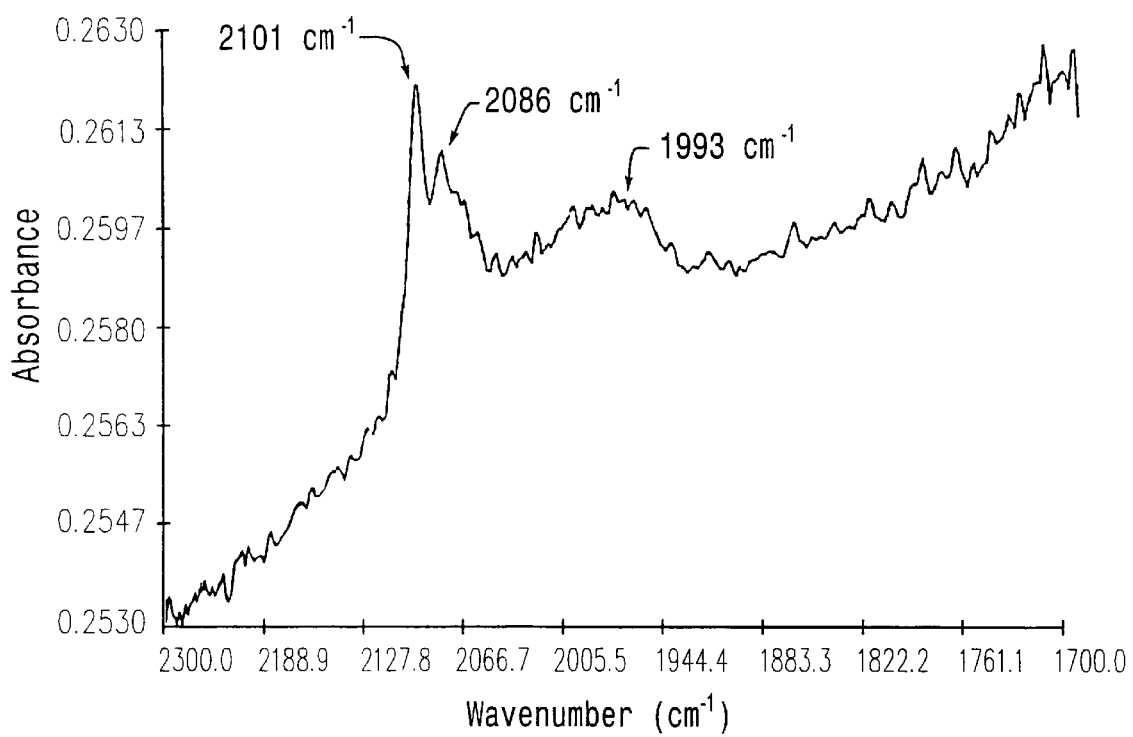
FIG. 9 shows the infrared absorption spectrum of a semiconductor film of the present invention.

FIG. 9 shows the spectrum of this silicon film measured by infrared absorption spectroscopy. It can be seen that the absorption peak strengths around 2102 cm$^{-1}$ and 2084 cm$^{-1}$ are stronger than the absorption peak strength around 2000 cm$^{-1}$.

Figure 10:
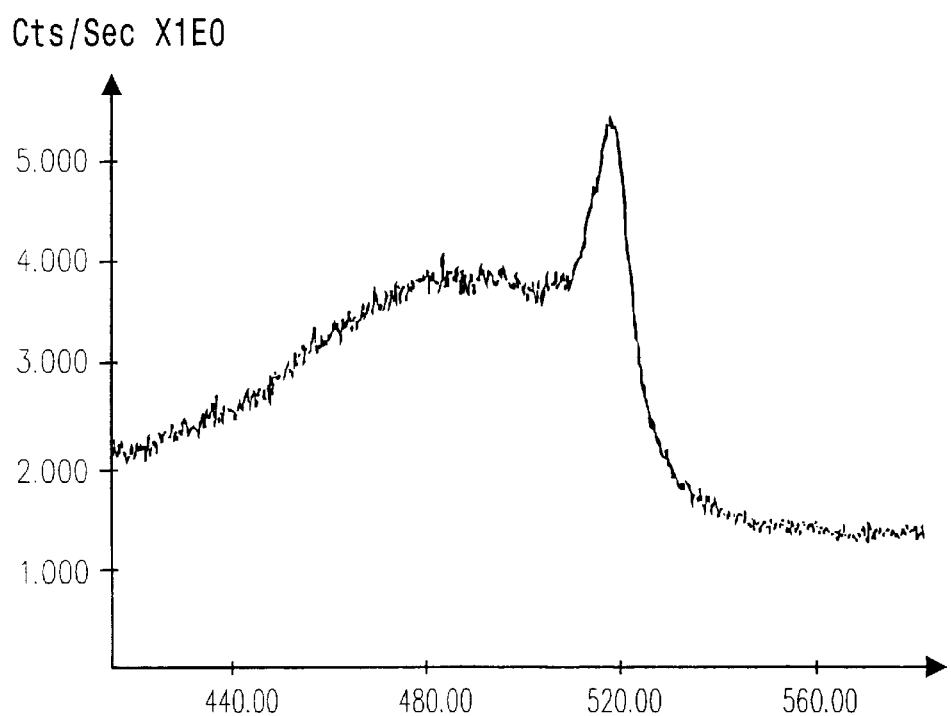
FIG. 10 shows the Raman spectrum of a semiconductor film of the present invention.

FIG. 10, moreover, shows the results of Raman spectroscopy measurements of this silicon film. A Raman shift from the crystalline components is seen around 520 cm$^{-1}$, indicating that the silicon film of this example has mixed crystallinity.

EXAMPLE 2

A thin film semiconductor device was fabricated using the as-deposited semiconductor film obtained as described in Example 1 as the active layer of a TFT.

First, underlevel protection layer 102, which consists of a silicon oxide film, is formed on substrate 101 by PECVD. Then, without breaking the vacuum, an intrinsic silicon layer which becomes the active layer of the thin film semiconductor device is sequentially deposited over this underlevel protection layer using the method described in Example 1. The thickness of the underlevel protection layer is 300 nm and the thickness of the semiconductor film is 90 nm. Accordingly, the semiconductor film deposition time is 247 seconds. Semiconductor films obtained in this way can be used in the as-deposited state as the active layer which serves, for example, as the channel region of the TFT.

After the substrate is removed from the PECVD reactor, these microconductor film is patterned and thin film layer 103, which later becomes the active layer of the transistor, is formed. [FIG. 3(a)]

Figure 3A:
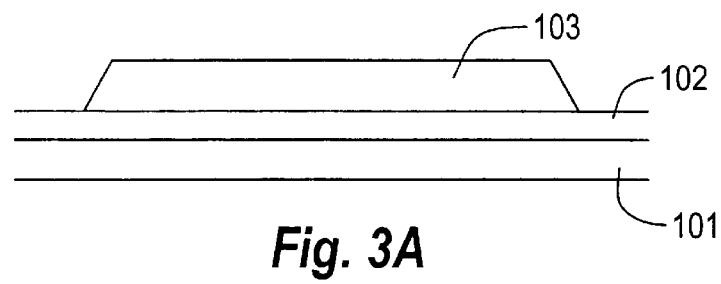
FIGS. 3(a)–(d) show cross-sectional views of an element in each of the thin film semiconductor device fabrication processes presented in one example of the present invention.
Figure 3B:
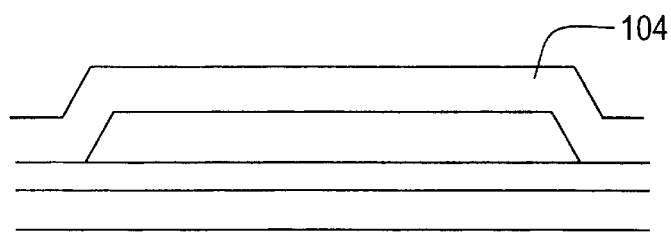

Gate insulator layer 104 is then formed by PECVD. [FIG. 3(b)] The gate insulator layer, which is comprised of a silicon oxide film, is deposited to a thickness of 100 nm at a substrate surface temperature of 350° C. using TEOS (Si—(O—CH$_2$—CH$_3$)$_4$), oxygen (O$_2$) and water (H$_2$O) as source gases and argon as a dilution gas. Following gate insulator layer deposition, the insulator film quality was improved through an approximately three hour anneal at about 350° C. under an atmosphere having an oxygen partial pressure of approximately 0.2 atmospheres and water vapor with a dew point of approximately 80° C.

Figure 3C:
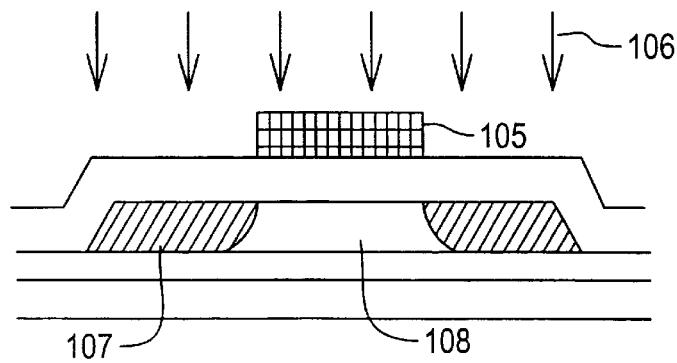

Then a tantalum (Ta) thin film, which becomes gate electrode 105, is deposited by sputtering. The substrate temperature at the time of sputtering is 150° C., and the film thickness is 500 nm. Patterning is carried out after the tantalum thin film which is to become the gate electrode is deposited. This is followed by implantation of impurity ions 106 in the semiconductor layer and formation of source and drain regions 107 and channel region 108. [FIG. 3(c)] At this time, the gate electrode serves as a mask for ion implantation, and the channel becomes a self-aligned structure which is formed only below the gate electrode. Impurity ion implantation is carried out using a non-mass separating ion implanter and phosphine (PH3) diluted by hydrogen to a concentration of approximately 5% as the source gas. The total ion implantation dose, including ions such as PH$_{3+}$ and H$_{2+}$, is 1×10$^{16}$ cm$^{-2}$ and the phosphorous atom concentration in the source and drain regions is approximately 3×10$^{20}$ cm$^{-3}$. The substrate temperature at the time of ion implantation was 250° C.

Next, interlevel insulator layer 109, comprised of a silicon oxide film, is formed by PECVD using TEOS. The substrate surface temperature during interlevel insulator layer deposition is 350° C., and the layer thickness is 500 nm. After the interlevel insulator layer is formed, thermal annealing is performed for 1 hour at 350° C. in an oxygen atmosphere to achieve activation of implanted ions and densification of the interlevel insulator layer. Contact holes are then opened to the source and drain, and aluminum (Al) is deposited by sputtering. The substrate temperature during sputtering is 150° C., and the film thickness is 500 nm. Patterning is carried out on the aluminum thin film source and drain electrodes 110 and interconnects to complete the thin film semiconductor device. [FIG. 3(d)]

The transistor characteristics of the thin film semiconductor devices that were experimentally fabricated in this way were measured. It was found that I$_{ON}$=(9.10+0.87, −0.80)× 10$^{-7}$A at a 95% confidence level. Here, the on current, I$_{ON}$, is defined as the source-drain current Ids when transistors are turned on at source-drain voltage of Vds=4 V and gate voltage of Vgs=10 V. The off current when the transistor was turned off at Vds=4 V and Vgs=0 V was I$_{OFF}$=(6.50+3.28, −2.19)×10$^{-13}$A. These measurements were taken at a temperature of 25° C. for transistors having channel length L=5 mm and width W=20 mm. The electron mobility found from the saturation current region was m=3.53±0.17 cm$^2$×V$^{-1}$.S$^-$ 1, and the threshold voltage was Vth 9.10±0.11 V. As described, this invention achieves the fabrication of extremely good thin film semiconductor devices having high mobilities that are three or more times higher than that of a-Si TFTs of the prior art by a process in which the maximum processing temperature (350° C.) is the same as that for a-Si TFTs of the prior art and, moreover, using an equivalent fabrication process (crystallization step unnecessary).

EXAMPLE 3

An active matrix substrate was fabricated using the thin film semiconductor devices obtained in Example 2 as the pixel switching elements for a high-definition color LCD which was comprised of 768 (rows)×1024 (columns)×3 (colors)=2359296 pixels. As in Example 2, the source electrode and source interconnects in Example 3 are aluminum; the drain electrodes, however, are indium tin oxide (ITO). A liquid crystal panel was manufactured that employed an active matrix substrate obtained in this way for one of the two substrates in the substrate pair. A liquid crystal display device was produced by assembling the liquid crystal panel thus obtained together with external peripheral driving circuits and a backlight unit. Because the TFTs are high performance and the parasitic capacitance of the transistors is extremely small, a high aperture ratio, bright, high-quality liquid crystal display device was obtained. In addition, because the fabrication process for the active matrix substrate is reliable, liquid crystal display devices can be produced reliably and at low cost.

This liquid crystal display device was installed in the body of a full-color portable personal computer (notebook PC). Because the thin film semiconductor devices are high performance, this notebook PC proved to be a good electronic device having an extremely beautiful display screen. In addition, the high aperture ratio of the liquid crystal display device made it possible to reduce the power consumed by the backlight. This, in turn, made it possible to decrease the size and weight of the batteries and allow long-time use. In this way, a compact, lightweight electronic device that can be used for extended periods while also offering, a beautiful display screen was achieved.

EXAMPLE 4

Figure 8:
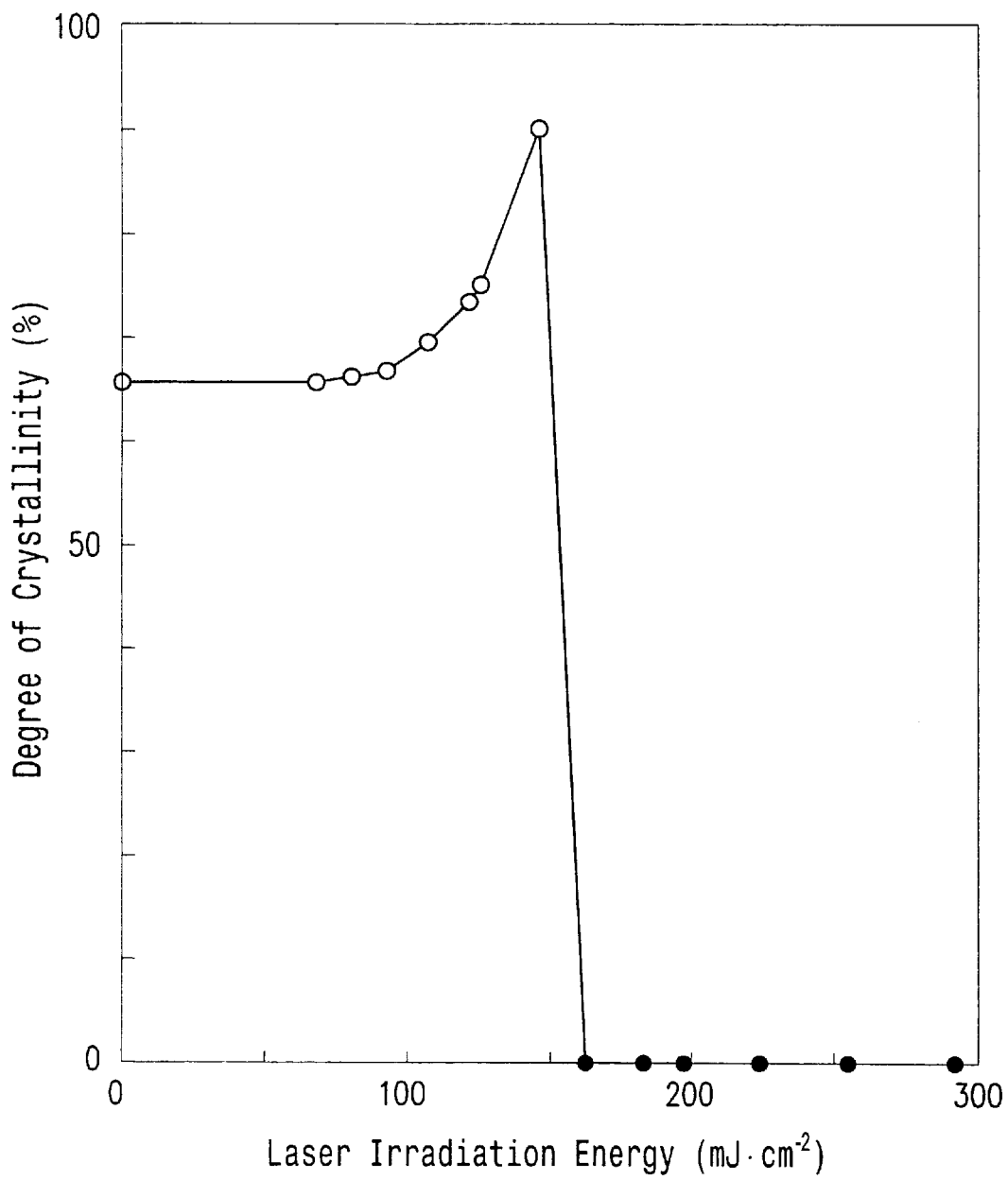
FIG. 8 shows the laser crystallization characteristics of a semiconductor film of the present invention.
Figure 11:
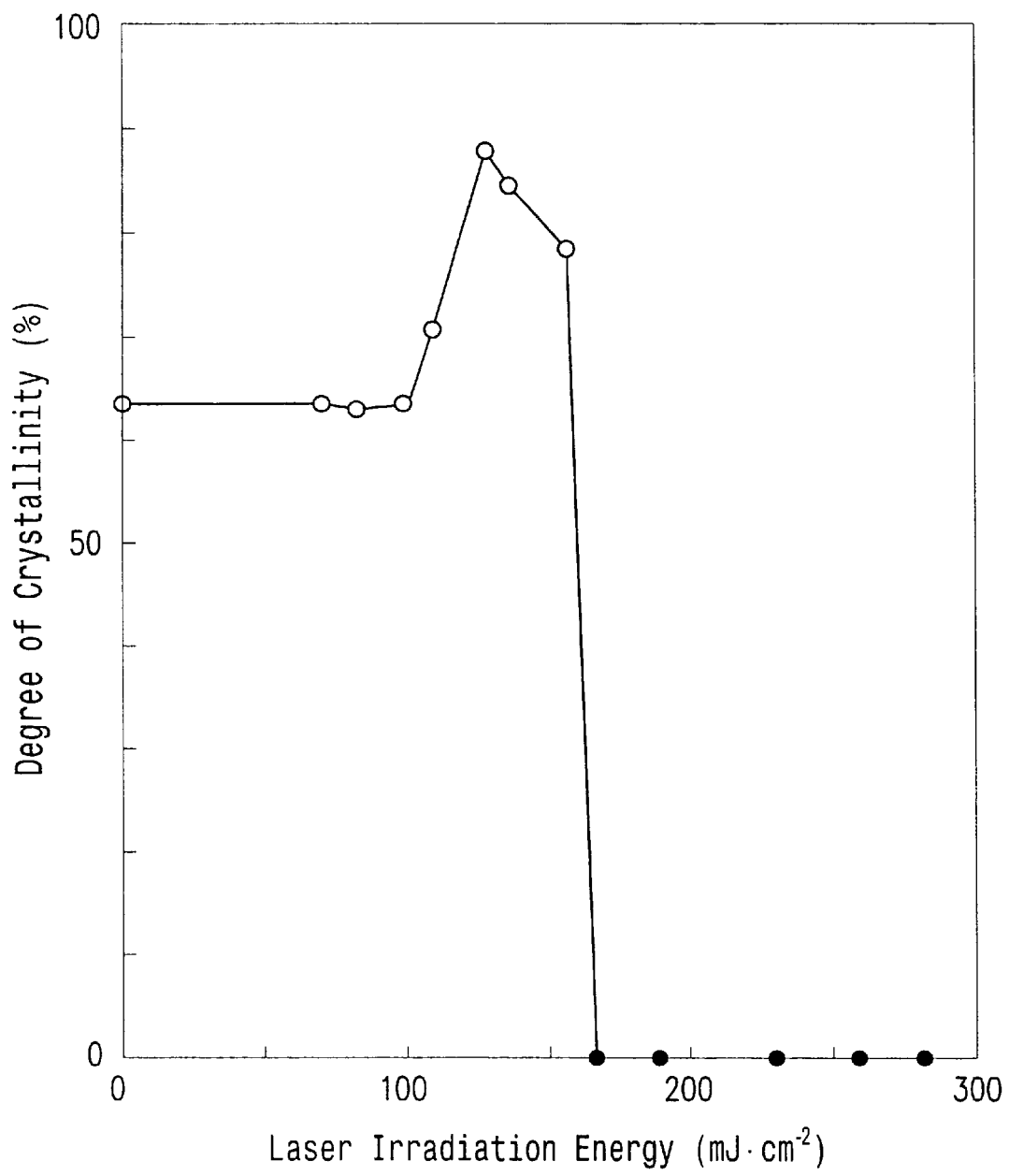
FIG. 11 shows the laser crystallization characteristics of a semiconductor film of the present invention.

An attempt was made to crystallize the semiconductor film obtained in Example 1 by irradiating it with a laser in the as-deposited state without first subjecting it to any form of thermal annealing. The results of this are shown in FIG. 11. FIG. 11 is read in the same way as FIG. 8. Irradiation was performed with an XeCl excimer laser having a wavelength of 308 nm and a full width at half maximum of approximately 45 nsec. The beam was square and measured about 1 cm×1 cm, and laser irradiation was performed only once at each energy. FIG. 11 shows that crystallization of the semiconductor film obtained in Example 1 proceeds thoroughly between a laser energy density of about 110 mJ×cm$^{-2}$ and a density of about 160 mJ×cm$^{-2}$. A maximum degree of crystallinity of 88% was achieved for this semiconductor film for a single-stage laser irradiation at an energy density of 125 mJ×cm$^{-2}$, thus producing a high quality crystalline semiconductor film. As shown in Example 4, using the semiconductor film of the present invention, high-quality polycrystalline semiconductor films having a high degree of crystallinity can be fabricated at comparatively low laser energy densities by a simple laser irradiation even without first performing dehydrogenation annealing or any other manner of thermal annealing used in the prior art.

EXAMPLE 5

A thin film semiconductor device having as the active layer a crystalline semiconductor film formed by irradiating the semiconductor film obtained in Example 1 with a laser in the as-deposited state without first subjecting it to any form of thermal annealing was fabricated.

First, underlevel protection layer 102, comprised of a silicon oxide film, was formed by PECVD on large glass substrate 101 measuring 360 mm×475 mm. Then, without breaking vacuum, an intrinsic silicon layer was sequentially deposited on top of this underlevel protection layer using the method described in Example 1. The thickness of the underlevel protection layer is 300 nm, and the thickness of the semiconductor layer is 60 nm. This type of melt crystallization of the semiconductor films, which are in the as-deposited state and have not been subjected to any form of thermal annealing, is carried out by laser irradiation.

Irradiation is performed using a KrF excimer laser with a wavelength of 248 nm and a frill width at half maximum of approximately 33 nsec. The laser beam has a line shape measuring 120 mm in width and 38 cm in length. The amount of width-wise overlap of the beam in each irradiation is 90% of the beam width. Therefore, the beam advances 12 mm after each irradiation, and the same point on the semiconductor film is exposed to laser irradiation 10 times: The laser light energy density is 150 mJ×cm$^{-2}$ and laser light irradiation is performed in a vacuum with a background pressure of about 1×10$^{-6}$ Torr. The substrate temperature during laser irradiation is room temperature, about 25° C.

Measurement by multiple wavelength spectroscopic ellipsometry showed the semiconductor films crystallized in this way to have a degree of crystallinity of 95% and a thickness of 55 nm results of Raman spectroscopy measurements revealed a sharp crystalline-component Raman shift peak of about 4.5 cm$^{-1}$ full width at half maximum around 515.9 cm$^{-1}$, evidence that high-quality films having extremely high crystallinity were formed. Further, observation by transmission electron microscopy revealed that this semiconductor film is comprised of crystals having grain diameters ranging from about 200 nm to about 500 nm. After completion of the crystallization process, this crystalline semiconductor film is patterned and semiconductor film 103, which later becomes the active layer of the transistor, is formed.

[FIG. 3(a)]

Figure 3D:
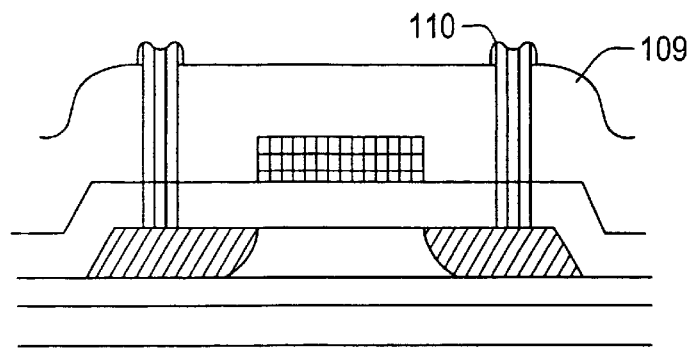
Figure 4:
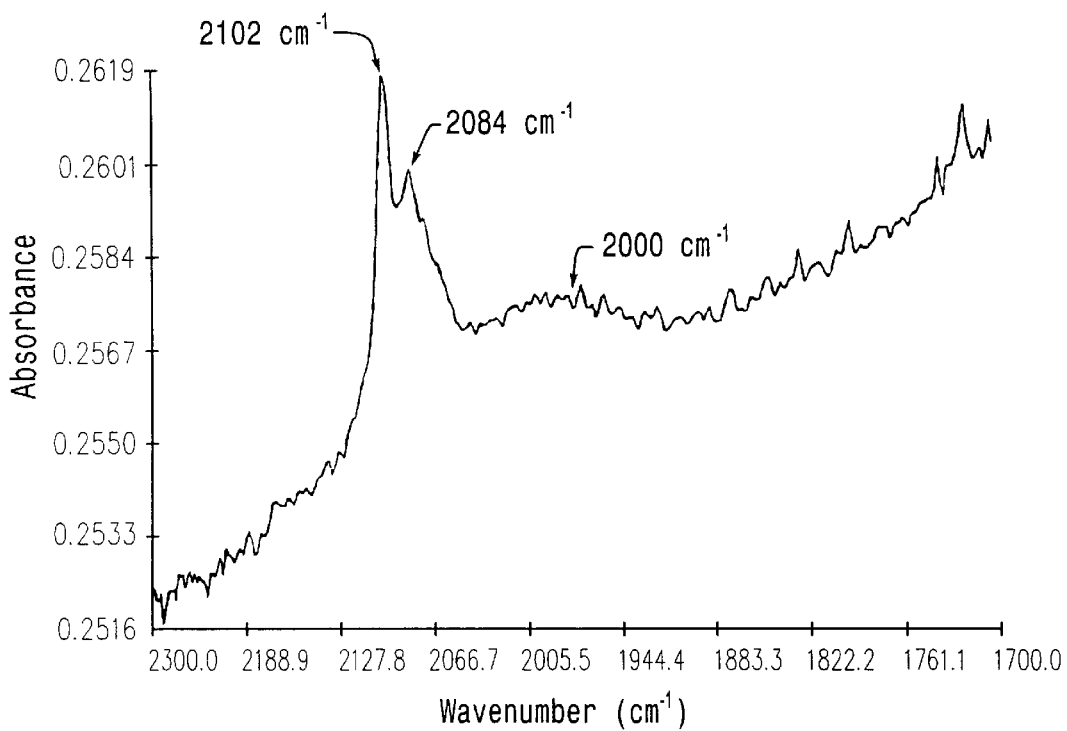
FIG. 4 shows the infrared absorption spectrum of a semiconductor film of the present invention.
Figure 5:
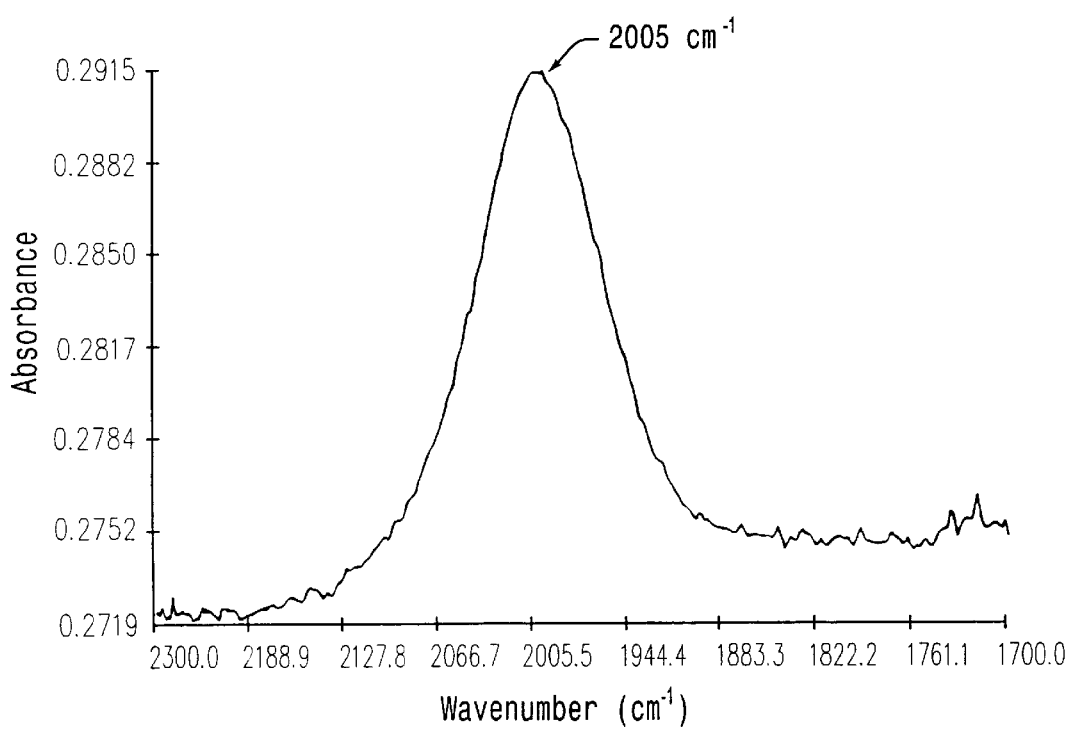
FIG. 5 shows the infrared absorption spectrum of an a-Si film of the prior art.
Figure 6:
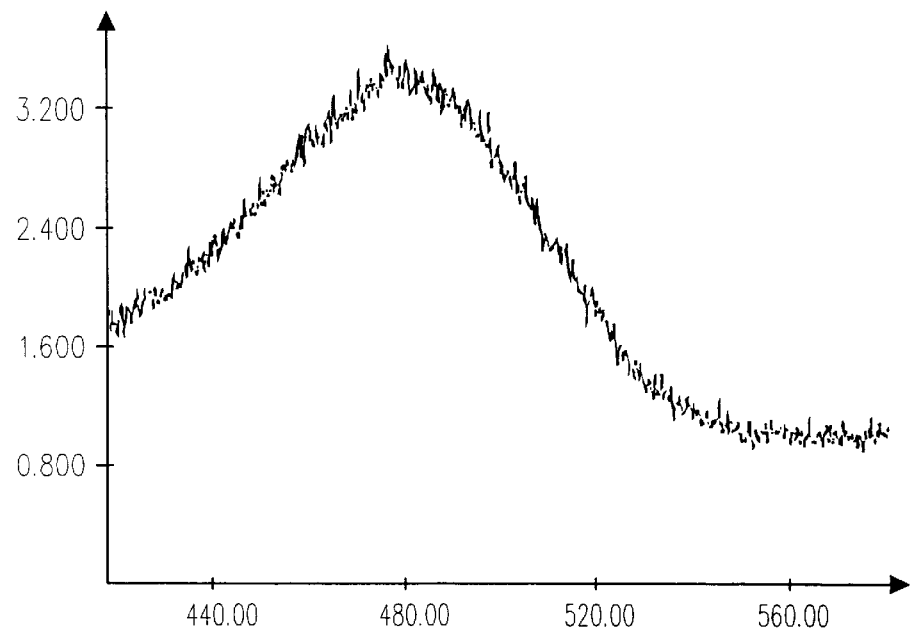
FIG. 6 shows the Raman spectrum of an a-Si film of the prior art.
Figure 7:
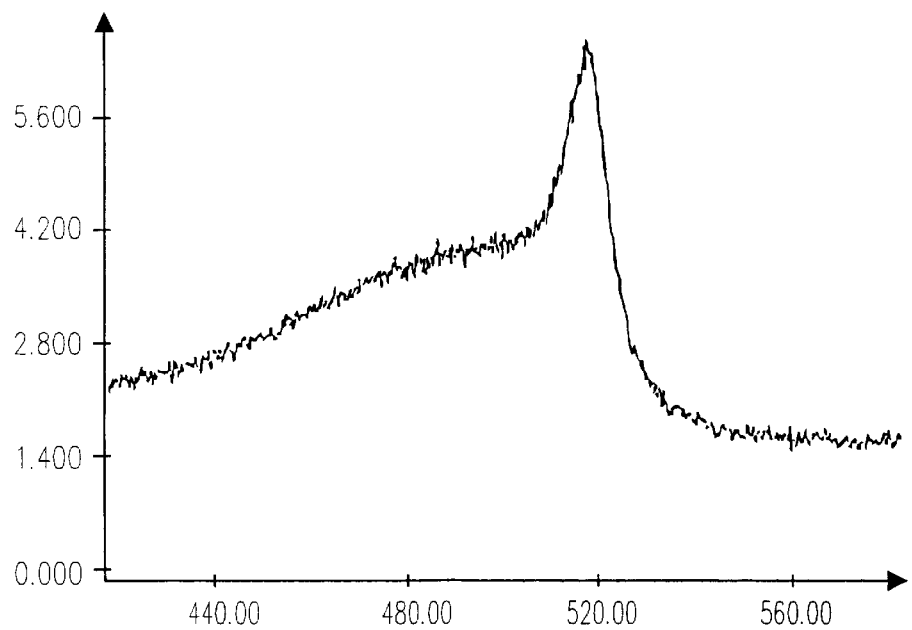
FIG. 7 shows the Raman spectrum of a semiconductor film of the present invention.

With the exception of the source and drain formation process by ion implantation, all subsequent processes, from gate insulator layer formation to source and drain electrode and interconnect formation, are performed exactly as described in Example 2, thus finishing the thin film semiconductor device. [FIG. 3(d)] In Example 5, because CMOS TFTs are being formed, both NMOS TFTs and PMOS TFTs are formed on a single substrate. The PMOS TFTs are covered with polyimide during formation of the sources and drains of the NMOS TFTS; conversely, the NMOS TFTs are covered with polyimide during formation of the sources and drains of the PMOS TFTS, thereby making CMOS TFTS. Impurity ions are implanted in the NMOS TFT in the exact same manner as described in Example 2. The implantation of impurity ions in the PMOS TFT is also performed using a non-mass separating ion implanter. Diborane (B$_2$H$_6$) diluted to a concentration of approximately 5% is used as the source gas. The total ion implantation dose, including ions such as B$_2$H$_{6+}$ and H$_{2+}$, was 1×10$^{16}$ cm$^{-2}$; and the boron atom concentration in the source and drain regions was approximately 3×10$^{20}$ cm$^{-3}$. The substrate temperature during ion implantation was 250° C., just as in Example 2.

The transistor characteristics of the thin film semiconductor devices that were experimentally fabricated in this way were measured. The measurement conditions and definitions were the same as those described in Example 2. (However, the Vgs and Vds of the PMOS TFTs have the reverse polarity of NMOS TFTS.) In this example, the purpose of the investigation was to examine the performance of transistors and their nonuniformity over the substrate and measurements were taken for 50 transistors having channels of length L=5 mm and width W=5 mm formed regularly over the entire surface of a large glass substrate. The results are as follows.

NMOS TFT $I_{ON}=(61.9+7.5, -5.7)\times10^{-6}A$ $I_{OFF}=(1.66+0.63, -0.44)\times10^{-12}A$ $m=103.4\pm10.5 cm^2.V^{-1}.S^{-1}$ $Vth=2.17\pm0.14V$

PMOS TFT $I_{ON}=(43+3.9, -3.4)\times10^{-6}A$ $I_{OFF}=(4.64+1.19, -0.96)\times10^{-13}A$ $m=57.75\pm5.03\ cm^2.V^{-1}.S^{-1}$ $Vth=-1.12\pm0.11V$ As described, this invention enabled the uniform fabrication of extremely good CMOS thin film semiconductor devices having high mobility by a process in which the maximum temperature (350° C.) is identical to the maximum process temperature for a-Si TFTs of the prior art and, moreover, on large, conventional glass substrates. The TFTs obtained in this Example 5 have extremely good reliability because of the good crystalline semiconductor layer and gate insulator layer and operate stably over a long time frame.

The uniformity of laser crystallization, whether within a substrate or from lot to lot, has been a very serious problem in the low temperature process of the prior art. This invention, however, greatly reduces the nonuniformity of both on current and off currents. This marked improvement in uniformity is a result not only of the relatively stable laser, venerator but also implies that the initial silicon film is stable with respect to fluctuations in the laser generator. In other words, even if the laser transmission energy fluctuates slightly, as shown in FIG. 11, the energy region for crystallization is wide and the crystalline components in the mixed-crystallinity film regulate the melt crystallization process. This invention takes advantage of this principle and achieves marked improvement with respect to lot-to-lot fluctuations.

As described, this invention enables silicon and other semiconductor films to be crystallized extremely reliably by laser or other energy irradiation. Therefore, LCDs employing thin film semiconductor devices of this invention exhibit uniform high picture quality across the entire screen. Moreover, the thin film semiconductor devices of this invention can also easily be used to form not only simple circuits such as shift registers and analog switches but also more complex circuits such as level shifters, digital analog converter circuits and even clock, venerator circuits, gamma correction circuits, and timing controller circuits.

EXAMPLE 6

Figure 12:
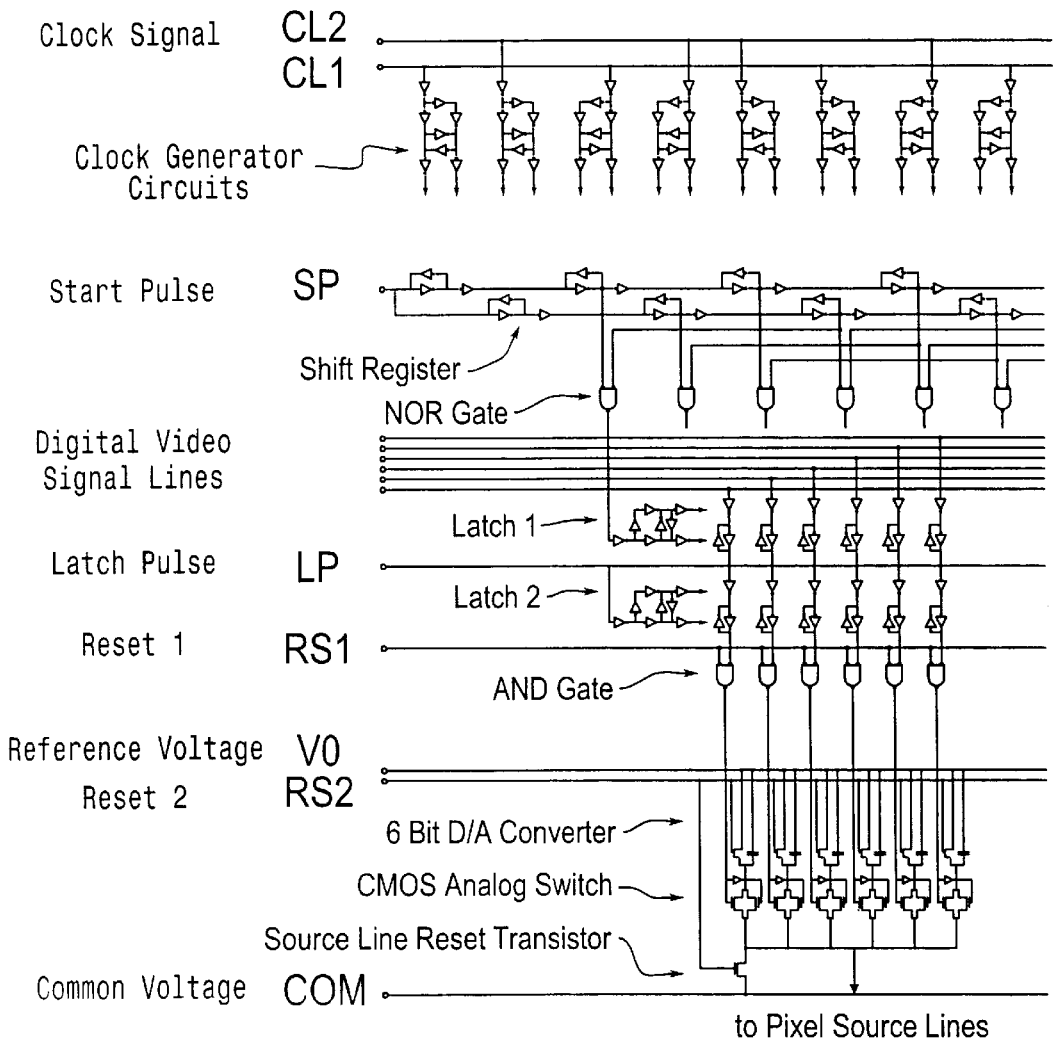
FIG. 12 depicts a digital data driver used in the present invention.
Figure 13A:
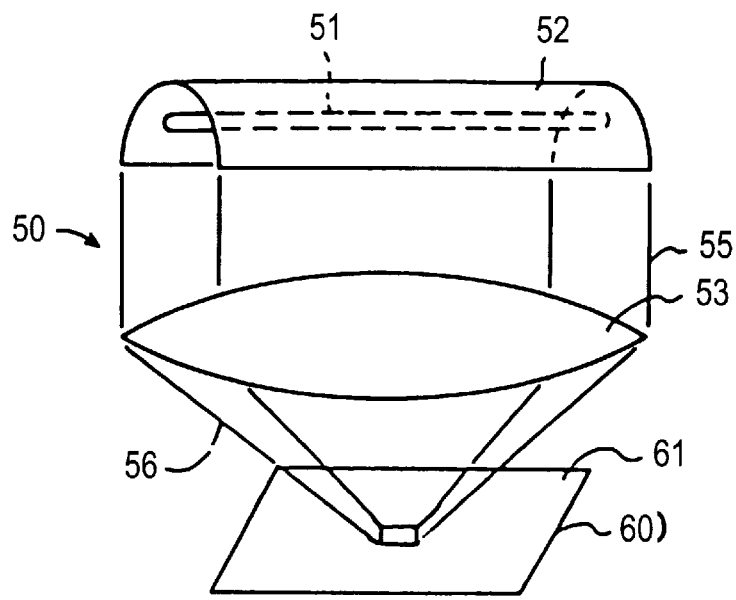
FIG. 13 shows the high energy optical irradiation unit used in the present invention.
Figure 13B:
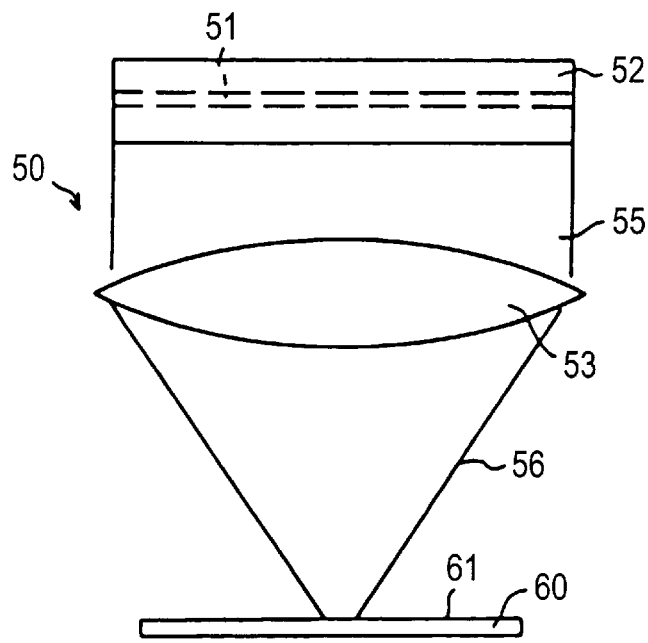
Figure 13C:
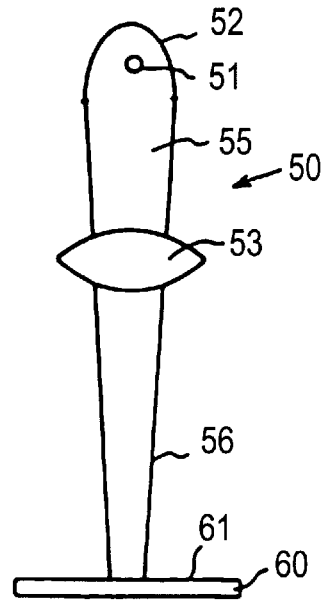

An active matrix substrate for a color LCD having 200 (rows)×320 (columns)×3 (colors)=192,000 pixel switching elements using NMOS thin film semiconductor devices obtained as described in Example 5 and integrated 6-bit digital data drivers (column drivers) and scanning drivers (row drivers) using CMOS thin film semiconductor devices obtained as described in Example 5 was produced. FIG. 12 is a circuit diagram of a 6-bit digital data driver. The digital data driver of this example is comprised of a clock signal line and clock generator circuit, shift register circuit, NOR gates, digital video signal lines, latch circuit 1, latch pulse line, latch circuit 2, reset line 1, AND gates, reference voltage line, reset line 2, 6-bit capacitance division D/A converter, CMOS analog switches, common voltage line, and a source line reset transistor. The outputs from the CMOS analog switches is connected to the pixel source lines. The capacitance of the D/A converter portion satisfies the relationship $C_0=C_1/2=C_2/4$ $C_3/8=C_4/16=C_5/32$. Digital video signals output from the video random access memory (VRAM) of a computer can be input directly to the digital video signal lines. In the pixel portion of the active matrix substrate described in this example, the source electrodes, source interconnects, and drain electrode (pixel electrode) are comprised of aluminum, forming a reflective LCD.

A liquid crystal panel was produced that employed an active matrix substrate achieved as described for one of the two substrates in the substrate pair. A normally-black mode (the display is black when a voltage is not being applied to the liquid crystal) reflective liquid crystal panel was made using a polymer-dispersed liquid crystal (PDLC) with dispersed black pigment for the liquid crystal held between the substrate pair. This liquid crystal panel was connected to external wiring to produce a liquid crystal display. The result was a liquid crystal display device having high display quality: both the on resistance and transistor capacitance of the NMOS and PMOS were equal; moreover, the TFTs offered high performance, while the parasitic capacitance of the transistors was extremely low; and, because the characteristics were uniform over the entire substrate, both 6-bit digital data drivers and scanning drivers operated normally in a wide operating region. In the pixel region, since the aperture ratio was high, a high display quality liquid crystal device was achieved even with a dispersed black pigment PDLC. In addition, because the manufacturing process for the active matrix substrate is reliable, liquid crystal display devices can be manufactured reliably and at low cost.

This liquid crystal display was installed in the body of a full-color portable personal computer (notebook PC). Since the active matrix substrate was equipped with integrated 6-bit digital data drivers and since digital video signals from the computer were input directly to the liquid crystal display device, the circuit configuration was simplified, while power consumption was simultaneously reduced to an extremely low level. The high performance of the liquid crystal thin film semiconductor device gave this notebook PC an extremely attractive display screen and made it a good electronic device. In addition, because this is a reflective liquid crystal display device with high aperture ratio, a backlight was unnecessary. The absence of a backlight made it possible to decrease the size and weight of the batteries while simultaneously extending the length of time they can be used. Accordingly, an extremely small, light-weight electronic device with a beautiful display screen which has the potential for long-time use was fabricated.

Possible Industrial Applications

As stated above, the method of fabricating thin film semiconductor devices described by this invention enables the manufacture of high performance thin film semiconductor devices using a low temperature process in which inexpensive glass substrates can be used. Therefore, applying this invention to the manufacture of active matrix liquid crystal display devices permits large-size, high-quality liquid crystal display devices to be manufactured easily and reliably. Moreover, when this invention is applied to the manufacture of other electronic circuits, high quality electronic circuits can also be manufactured easily and reliably.

Additionally, because of their low cost and high performance, the thin film semiconductor devices of this invention are perfectly suited as the active matrix substrate of an active matrix liquid crystal display device. They are optimum devices to use as integrated-driver active matrix substrates which demand particularly high performance.

Their low cost and high performance also make the liquid crystal displays of the present invention optimum for full-color notebook PCs and other types of displays. Finally, because of their low cost and high performance, the electronic devices of this invention will likely gain wide general acceptance.

What is claimed is:

1. A fabrication process of a thin film semiconductor device having a semiconductor film as an active layer of a transistor, said semiconductor film being formed over a substrate, the fabrication process comprising:
   a first step of depositing a semiconductor film, in a reaction chamber at a pressure of not less than about 1.0 Torr and with an electrode separation of not less than about 17.8 mm, by plasma-enhanced chemical vapor deposition (PECVD) using a combined gas with a chemical specie containing elements of said semiconductor film as a source gas and argon (Ar) as another gas, said source gas having a concentration of not more than about 6.25% in said combined gas, said semiconductor film having at least two absorption peaks, a first absorption peak at about 2102±4 cm$^{-1}$ and a second absorption peak at about 2084±4 cm$^{-1}$, a strength of said first absorption peak being stronger than a strength of an absorption peak at about 2000±20 cm$^{-1}$; and a second step of increasing a crystallinity of said semiconductor film.

2. The fabrication process of a thin film semiconductor device of claim 1, wherein a deposition rate of the semiconductor film is not less than about 0.15 nm/sec.

3. The fabrication process of a thin film semiconductor device of claim 1, wherein the semiconductor film is silicon and the source gas is silane.

4. A fabrication process of a thin film semiconductor device having a silicon film as an active layer of a transistor, comprising:

forming said silicon film over a substrate so that said silicon film when measured by infrared absorption spectroscopy, has at least two absorption peaks, a first absorption peak at about 2102±4 cm$^{-1}$ and a second absorption peak at about 2084±4 cm$^{-1}$, wherein said first absorption peak strength is stronger than an absorption peak strength at about 2000±20 cm$^{-1}$.

5. A fabrication process of a thin film semiconductor device having a silicon film as an active layer of a transistor, said silicon film being formed over a substrate, the fabrication process of the thin film semiconductor device, comprising:

depositing the silicon film by plasma-enhanced chemical vapor deposition (PECVD) so that said silicon film has at least two absorption peaks, a first absorption peak at about 2102±4 cm$^{-1}$ and a second absorption peak at about 2084±4 cm$^{-1}$, wherein said first absorption peak strength is stronger than an absorption peak strength of about 2000±20 cm$^{-1}$ when measured by infrared absorption spectroscopy.

6. A fabrication process of a thin film semiconductor device having a silicon film as an active layer of a transistor, said silicon film being formed over a substrate, the fabrication process of the thin film semiconductor comprising:

a first step of forming the silicon film so that said silicon film has at least two absorption peaks, a first absorption peak at about 2102±4 cm$^{-1}$ and a second absorption peak at about 2084±4 cm$^{-1}$, wherein said first absorption peak strength is stronger than an absorption peak strength of about 2000±20 cm$^{-1}$ when measured by infrared absorption spectroscopy; and a second step of increasing a crystallinity of said silicon film.

7. The fabrication process of a thin film semiconductor device of claim 6, wherein the first step of forming the silicon film is performed by plasma-enhanced chemical vapor deposition (PECVD).

8. A fabrication process of a thin film semiconductor device having a silicon film as an active layer of a transistor, said silicon film being formed over a substrate, the fabrication process of the thin film semiconductor comprising:

a first step of forming the silicon film so that the silicon film has at least two absorption peaks, a first absorption peak at about 2102±4 cm$^{-1}$ and a second absorption peak at about 2084±4 cm$^{-1}$, wherein said first absorption peak strength is stronger than an absorption peak strength of about 2000±20 cm$^{-1}$ when measured by infrared absorption spectroscopy; and a second step of exposing said silicon film to one of optical energy and electromagnetic wave energy irradiation.

9. The fabrication process of a thin film semiconductor device of claim 8, wherein the first step of forming the silicon film is performed by plasma-enhanced chemical vapor deposition (PECVD).

* * * * *

UNITED STATES PATENT AND TRADEMARK OFFICE
CERTIFICATE OF CORRECTION

PATENT NO. : 6,391,690 B2
DATED : May 21, 2002
INVENTOR(S) : Mitsutoshi Miyasaka It is certified that error appears in the above-identified patent and that said Letters Patent is hereby corrected as shown below:

<u>Title page,</u>
Item [63], to read as follows: -- [63] Continuation-in-part of application No. 08/633,723, filed as application No. PCT/JP95/02568 on Dec. 14, 1995. --

Signed and Sealed this

Twenty-fourth Day of December, 2002

JAMES E. ROGAN
*Director of the United States Patent and Trademark Office*